(12) United States Patent
Atwood et al.

(10) Patent No.: US 7,301,791 B2
(45) Date of Patent: Nov. 27, 2007

(54) SEMICONDUCTOR DEVICE

(75) Inventors: Bryan Atwood, Tokyo (JP); Takao Watanabe, Fuchu (JP)

(73) Assignee: Renesas Technology Corp., Tokyo (JP)

( * ) Notice: Subject to any disclaimer, the term of this patent is extended or adjusted under 35 U.S.C. 154(b) by 100 days.

(21) Appl. No.: 11/325,311

(22) Filed: Jan. 5, 2006

(65) Prior Publication Data

US 2006/0171236 A1    Aug. 3, 2006

(30) Foreign Application Priority Data

Jan. 7, 2005    (JP)    ............................. 2005-002024

(51) Int. Cl.
    *G11C 15/00*    (2006.01)
(52) U.S. Cl. .................... 365/49; 365/230.03
(58) Field of Classification Search ............... 365/49, 365/230.03, 154; 711/5
    See application file for complete search history.

(56) References Cited

U.S. PATENT DOCUMENTS

| | | | | |
|---|---|---|---|---|
| 5,617,347 A | * | 4/1997 | Lauritzen | 365/49 |
| 5,825,682 A | * | 10/1998 | Fukui | 365/49 |
| 7,219,185 B2 | * | 5/2007 | Luick | 711/5 |
| 2004/0225829 A1 | | 11/2004 | Akiyama et al. | |

* cited by examiner

*Primary Examiner*—Anh Phung
(74) *Attorney, Agent, or Firm*—Miles & Stockbridge P.C.

(57) ABSTRACT

A semiconductor device capable of accessing to the memory with a high speed, and comprising a memory with a large capacity. The semiconductor device comprises a plurality of memory banks (Bank) 1 to 3 where the write cycle time is twice as long as the read cycle and each provided with the separate write and read ports, and two cache data banks CD0 and CD1, in which, for example, in the case that an external write instruction with continuous cycles is issued in cycle #2, the data of Bank 2 stored in CD1, Row 2 cannot be written back since Bank 2 is busy with the cycle #1, the data of Bank 0 stored in CD 0, Row 2 can be written back instead.

12 Claims, 12 Drawing Sheets

READ ACCESS, CACHE HIT STATE

WRITE ACCESS, CACHE HIT STATE

READ ACCESS, CACHE MISS, BANK "BUSY CANCEL" STATE

WRITE ACCESS, CACHE MISS, BANK "BUSY CANCEL" STATE

READ ACCESS, CACHE MISS, BANK "BUSY" STATE

WRITE ACCESS, CACHE MISS, BANK "BUSY" STATE

CYCLE #1: WRITE ACCESS, CACHE MISS STATE

Bank 0, Row 1

CYCLE #2: WRITE ACCESS, CACHE MISS STATE

Bank 1, Row 2

CYCLE #3: WRITE ACCESS, CACHE MISS STATE

Bank 2, Row 1

CYCLE #4: READ ACCESS, CACHE MISS STATE

Bank 1, Row 0

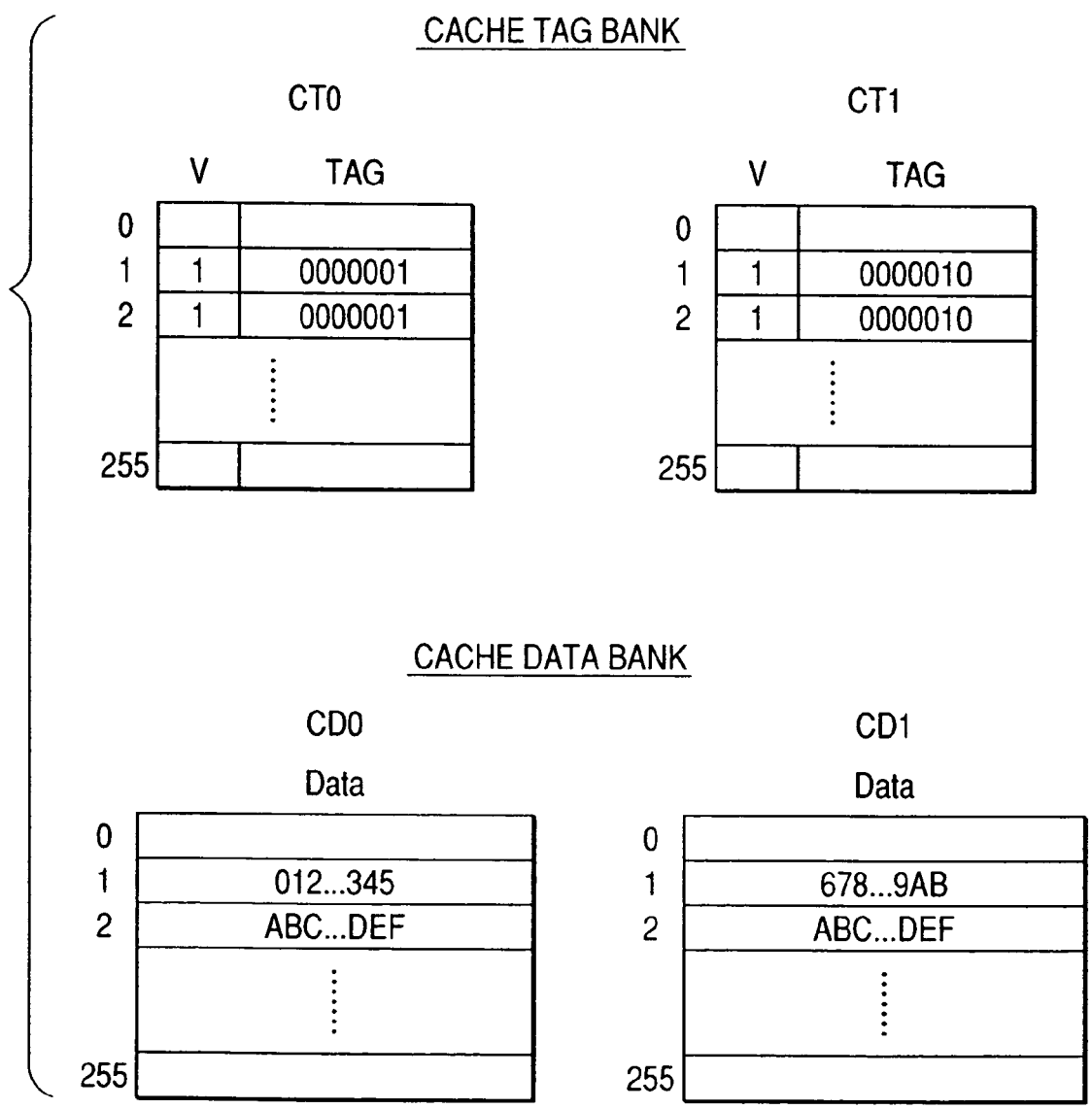

CYCLE #1: WRITE ACCESS,
CACHE MISS STATE

Bank 0, Row 1

CYCLE #2: WRITE ACCESS,
CACHE MISS STATE

Bank 3, Row 2

CYCLE #3: WRITE ACCESS,
CACHE MISS STATE

Bank 3, Row 3

CYCLE #4: READ ACCESS,
CACHE MISS STATE

Bank 0, Row 2

SEMICONDUCTOR DEVICE

CLAIM OF PRIORITY

The present application claims priority from Japanese application JP 2005-002024 filed on Jan. 7, 2005, the content of which is hereby incorporated by reference into this application.

FIELD OF THE INVENTION

The present invention relates to the semiconductor device including memories and more particularly to an effective technique for implementing fast and no-latency external access to the memories with memory cells having slow data write operations.

BACKGROUND OF THE INVENTION

According to the inventors, memories currently used are as follows:

The most common memory is an SRAM with memory cells using 6 transistors. This memory is widely used as a single memory or an on-chip cache for a processor and the like, because it can be fabricated with a general transistor fabrication process.

Another common memory is a DRAM with memory cells composed of one transistor and one capacitor. This memory is also widely used for the main memory of personal computers due to its large capacity memory, because a DRAM is more highly integrated than a SRAM, although there is a problem to require a capacitor fabrication process.

SUMMARY OF THE INVENTION

Investigation of the inventors on the operation speed of the memories shows the following;

A DRAM is inferior to a SRAM in high speed read operation, because the DRAM is not of a so called gain-cell structure activating bit lines by transistors as a SRAM does, although it reads a stored charge in the capacitor onto the bit line. A gain-cell memory which is more highly integrated than a SRAM is available, for example, a memory cell with 3 transistors. The memory cell comprises transistors, for example, each corresponding to storing, write or read, and the storing transistor has a gate for write binary information, and the like.

In such a memory configuration, a high speed read operation can be implemented as that of a SRAM, because the bit lines are activated by transistors in the read operation. However, it is difficult to make a write speed equivalent to that of a SRAM, because a large on-current of the write transistor causes a problem in order to improve the retention characteristics of memory. Although depending on a design, write operation may possibly take time longer than that of read operation.

Accordingly, a new architecture and circuit technology are required to make a random access possible to a memory cell with a slow write access with nearly the same speed of SRAM. In other words, if such a slow write access is solved and a high speed external access becomes implemented with the memory cell, then such a memory cell is expected to be widely used as a highly integrated, high speed memory.

From the discussion mentioned above, therefore, the object of the present invention is to provide a semiconductor device with a high speed access to the memory, and also with a memory of large capacity.

The foregoing and other object, aspects, and advantages will be better understood from the following detailed description of the invention with reference to the drawings.

In the invention disclosed herein, the summary of preferred embodiments is described bellow.

The semiconductor device of the present invention including a plurality of memory banks, comprises: a first memory device capable of executing to read data in a first cycle time, executing write data in a second cycle time longer than the first cycle time, executing to read and write data in the same memory bank in the plurality of memory banks in parallel in time, and a second memory device capable of read and write data in the first cycle time, operates as a cache memory of the first memory device. In the case that the second memory device is a cache miss and cache full when a data write instruction is generated in the semiconductor device, the processing to select a memory bank which is not busy with write data from the plurality of memory banks in the first memory device, the processing to write-back the stored data corresponding to the selected memory bank from the stored data in the second memory device, and the processing to write input data associated with the write data instruction into the empty memory region in the second memory device arising from the write-back operation.

As for the first memory device, for example, a device is used to have a plurality of memory cells that have separate read and write ports. Such a memory cell, for example, may be a SESO (Single-Electron Shut-Off) memory cell including two or three transistors for each memory cell. In this case, the write port comprises a write word line and a write bit line connected to the gate and the drain of the write transistor, respectively, and the read port comprises a read word line and a read bit line connected to the gate and the drain of the read transistor, respectively. With such a memory cell, it is possible to execute in parallel in time to read data from a row (read word line) and to write data to another row (write word line) of the memory cell.

With such a memory cell, the write access is usually slower than the read access by a factor of two or more. In this case, the read access includes activating the read word line and measuring a current or voltage variation in the read bit line, whereas the write access includes setting the voltage of write bit line to a certain voltage, activating the write word line, and halting the write word line after a certain period of time has elapsed and data in the memory cell has reached to a preferable final state. Time duration required for the write access may reach as long as a few times longer than that for read access. For example, assuming that it takes one clock cycle to complete the read access, it takes two or more clock cycles to complete the write cycle.

Therefore, an additional circuit is provided including the second memory device in order to enable to store data from the external data bus with a maximum frequency equivalent to the read access clock cycle. By this method, the read and write data from and to the semiconductor memory can be continuously executed with the speed of clock cycle for the read access without an increase in waiting state or waiting time. Furthermore, addition of such a circuit configuration replaces a two port memory with a slow speed in the write operation with a fast speed SRAM memory, enabling the memory to have a large capacity.

The second memory device is, for example, a SRAM and the like, and at least two cache data banks are included having the row and the column configurations with the same size as those of a single memory bank in the main memory of the first memory device. Number of cache data banks required is equal to be the multiple of the write cycle versus the read cycle time of the main memory. For example, if the write cycle time is 3 times as long as the read cycle time, then 3 cache data banks are required. Furthermore, another cache data bank set is included in the second memory device to store each entry memory bank address in the bank set, thereby an external write operation becomes faster more effectively.

More specifically, when an external write command is generated accompanying an external input address including a row address, a section address, and a memory bank address, and an external input data, and a cache fit occurs, then a new data sequence (a row data or a part of its section data), is stored in the selected row of the cache data bank and the memory bank address of the data sequence is stored in the cache data bank. However, in the case of a cache miss and no empty cache data bank is available (i.e. a cache is full) in the selected row, it is necessary to write-back either of the data sequences of cache data bank in the selected row to the memory bank. That is, a write-back process is required. By executing the write-back process, one of cache entries is cleared, and new information (external input data) is stored therein, enabling the write cycle to be completed.

An external write command can be input one command per one clock cycle; however, it requires more cycles to complete the write-back process for the first memory device. Thus, a plurality of cache data banks and cache tag banks are provided to respond to continuing the write access.

Assuming the case that a continuing write accesses are input to a memory device with only one cache data bank and one cache tag bank, if the selected row of cache data bank is not empty, the write-back operation of the row data is necessary for the row data sequence. However, the write-back operation can not be executed if the memory bank addressed to be written back for the data sequence is busy with the write-back Operation in the previous cycle.

Hence, by providing a plurality of cache data banks and the cache tag banks corresponding to the length of write-back cycle, it becomes possible to implement an architecture wherein a non-busy memory bank is always available. Accordingly, it enables to respond to the continuous write access by selecting a non-busy memory bank and writing back the data sequence corresponding to the bank.

Because the read port and the write port are provided separately in the memory banks, the external read cycle is completed in a cycle, even if a read access enters a memory bank, which is busy with a cache miss or the like. This is because a write-back operation is not interrupted by a read operation. Thus, it makes possible to complete the read or write access operation in one cycle, that the memory device described above is able to replace an SRAM memory as a semiconductor memory in semiconductor devices, and to reduce the cost of the device.

In the invention disclosed herein, the advantageous effect obtained of preferred embodiments is briefly summarized as that a fast memory access can be implemented, and also a memory with a large capacity can be provided.

BRIEF DESCRIPTION OF THE DRAWINGS

FIG. 6 is a schematic drawing of an embodiment of the semiconductor device of the present invention for a cache data bank and a cache tag bank configurations;

DETAILED DESCRIPTION OF THE PREFERRED EMBODIMENTS

The preferred embodiments of the present invention are described in detail with reference to the drawings, wherein the same reference notation designates the same member basically throughout the drawings, without repetition of explanation.

First, the summary of the present invention is described: an embodiment of the semiconductor device of the invention includes either volatile or nonvolatile memory cells with separate read and write access ports, and employs a main memory device (the first memory device) compatible with a SRAM. For this kind of memory cells of main memory device, however, a write access requires more cycles than that of a read access. Therefore, a second memory device including a pair of cache data (the third memory device) and cache tag (the fourth memory device) banks, and their control circuit are provided in order to implement that continuous read and write accesses to the memory are completed within one cycle without any wait states or latencies under any access patterns. Details are described thereon in the following.

Figure 1:
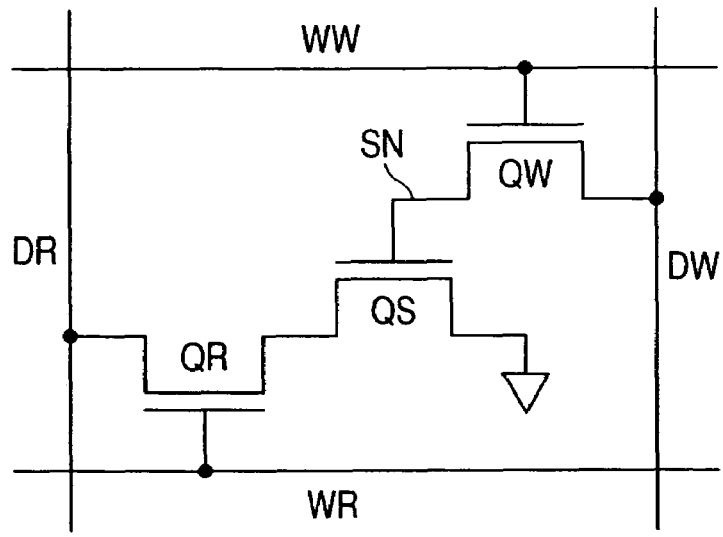
FIG. 1 is a circuit diagram of the memory cell configuration in the main memory device in accordance with an embodiment of the present invention.

FIG. 1 is a circuit diagram of the memory cell configuration in the main memory device in an embodiment of the present invention. The memory cell in FIG. 1 includes a separate read and write access port, and three transistors to store data. Data is stored as an electric charge on the storage node SN in the memory cell, which forms the gate of storage transistor QS. If a high data value is stored as a high electric charge on the storage node SN, the channel of storage transistor QS is set in the conduction region of operation. While, if a low data value is stored on the storage node SN as a low electric charge, the channel of storage transistor QS is off.

The data values are read by activating the read transistor QR and detecting the variation in current or voltage on the data read line DR that is affected by the conduction state of the storage transistor QS. A data write operation is executed by setting a high or low voltage on the data write line DW and activating the write transistor QW. A write cycle is completed by setting the write transistor QW in inactive state after the voltage of storage node SN reaches to be equal to the voltage of data write line DW.

The write transistor QW is preferably a device with low conductivity, such as a SESO transistor to reduce the leakage of stored charge in the standby state. However, in this case the write operation takes more cycles to complete than the read operation, because charging of the storage node SN becomes slower.

An SESO transistor is defined as a transistor with a channel region formed with a thin film in the present invention. The SESO transistor utilizes a quantum mechanical effect known as a carrier concentration effect, which means the channel thickness of less than or equal to 5 nm is suitable, or even 2 nm is more preferable to 2.5 nm. By the way, for a field effect transistor with a thin film channel, the thickness of the channel is not more than 5 nm, and means an average. The problem is with the thickness of transistor channel region, so the average height of the transistor channel region is not more than 5 nm. Furthermore, the channel region of the transistor is composed of a plurality of semiconductor crystal grains with a breadth of not more than 5 nm, i.e. a polycrystalline film (usually silicon polycrystalline film).

Figure 2:
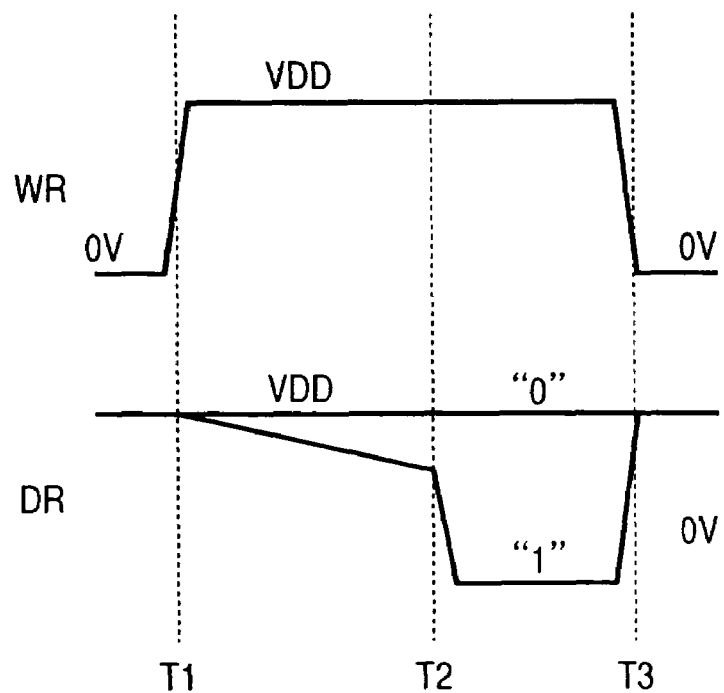
FIG. 2 is a waveform diagram of the read operation of the memory cell in FIG. 1.

FIG. 2 is a waveform diagram during the read operation of the memory cell shown in FIG. 1. As shown in FIG. the data read line DR is precharged to a voltage VDD, and the read cycle begins at timeT1. The voltage signal on the data read line DR starts either to lower for logic "1" (0 V level) or to remain constant at logic "0" (VDD level). At time T2, the voltage of the data read line DR is amplified by a sense amplifier either to logic level "1" or to logic level "0", so that the peripheral circuits such as a main amplifier can determine the data value. At time T3, the voltage of the word read line WR is lowered to 0V, and that of the data read line is precharged to VDD, and the read cycle is completed.

Figure 3:
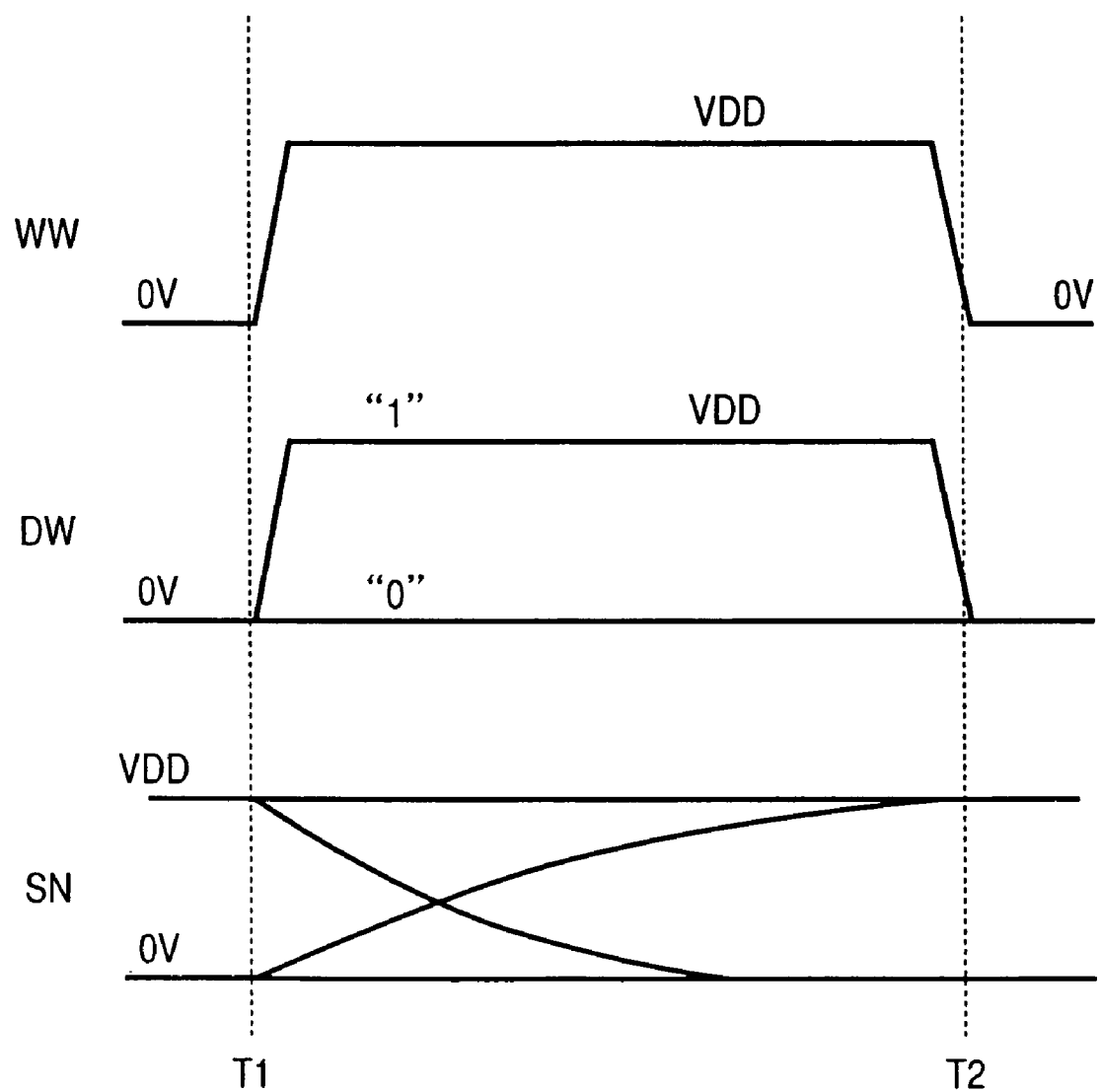
FIG. 3 is a waveform diagram of the write operation of the memory cell in FIG. 1.

FIG. 3 is a waveform diagram during the write operation of the memory cell shown in FIG. 1. As shown in FIG. the voltage of data write line DW is set either to logic level "1" (VDD level) or to logic level "0" (0 V level). The write transistor QW is activated by the word write line WW, and the voltage of storage node SN becomes gradually equal to the voltage of data write line DW through the write transistor QW. The cycle is completed with deactivation of the write transistor. If the conduction of write transistor QW is low, the write cycle may require more cycles to complete the write cycle than the read cycle in some cases.

There are some memory cells which require a refresh cycle. The refresh cycle is not investigated here for the embodiments of the present invention, and assumed another additional circuit configuration to be provided if necessary.

If a memory device including a memory cell with 2 ports described above is employed, the slow speed write access inherent with the 2 port memory cell must be converted to enable a faster read access by some means, which is described as follows. Assuming a main memory bank (hereafter abbreviated as a memory bank) comprising a plurality of rows and columns, 2 port memory cells described above are employed for each cell thereof, and a plurality of such banks are provided.

A problem with the write cycle being too long will be solved by adding cache data and cache tag banks to the device capable of storing the write data from an external write bus even when an internal write access to the memory bank is under execution. The cache data banks can be, for example, constructed of SRAM memory cells. Furthermore, the cache data banks are assumed to be dual port or able to execute one read and one write access in the length of time that a read cycle to the memory bank is completed.

The cache tag banks are prepared to record each data registered in the cache data banks corresponds to which memory bank. The size of rows and columns of a cache data bank is the same as that of a single memory bank. The number of cache data banks to be provided is at least integer ratio of the write cycle time to the read cycle time of the memory bank. For example, if the length of write cycle time is two times as long as that of read cycle time, then 2 more cache data banks are to be provided.

For better understanding, the main memory device is assumed to have 8 Megabytes memory capacity in an embodiment of the present invention. The main memory device is comprised of 128 two port memory banks, each memory bank having 256 bits columns divided into 8 sections of 32 bits each and 256 rows.

On an external read or write access, the memory location is specified by an 18 bit address value. The address bits 11 to 17 select the memory bank, bits 3 to 10 select the row, and bits 0 to 3 select one of the 8 sections mentioned above.

Furthermore, the memory bank is assumed to be composed of destructive-write memories in the present embodiment. For a destructive write memory, the entire row contents are written on a write access. That is, for example, for a data line of 256 bits the memory contents are updated in 256 bit units on write access. On the other hand, an SRAM memory has a non-destructive write memory, wherein the memory contents may be updated in 32 bit unit of 256 bits with the other 224 bits remaining at the present contents on a write access. The arrangement required for the applications of destructive-write memories to the memory bank will become clear in the embodiments shown later.

FIG. 4 shows the summary of basic operations of an embodiment of the present invention with the bock diagrams FIG. A to FIG. F each corresponding to one of different instructions and states. In these figures, the write operation is assumed to be twice as log as the read operation, and thus two cache data banks, CD0 and CD1 are provided. Similarly, if a main memory with a longer write operation is employed, for example, the write operation is three times as log as the read operation, then three cache data banks are required.

For read and write operations, FIG. 4 also shows the cases; (1) a cache hit, (2) a cache miss and to access to a non-busy memory bank, and (3) a cache miss and to access to a busy memory bank. A "busy state" memory bank is a memory bank that is undergoing a 2-cycle write-back operation in which data from the data bank is written back to and stored in the memory bank.

A "cache hit" is defined as follows. When a read or write operation begins, the row is specified by the input address, and the contents of the row is read from a plurality of cache tag banks. If one of the contents (memory bank address) read from a plurality of cache tag banks is the same as the bank indicated by the input address, then a cache hit has occurred. That means the most recent data of that location is stored in the cache data bank. A "cache miss" is the case where data from other banks is stored in the selected row of the cache data bank, thus the most recent data is stored in the memory bank.

Figure 4A:
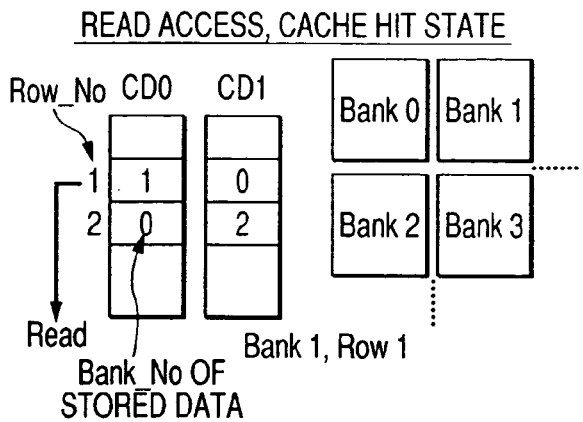
FIG. 4A shows an embodiment of the semiconductor device of the present invention under a read access and a cache hit state.

Three cases mentioned above in the read operations will be described in detail. FIG. 4A is for a cache hit, the most recent data is in the cache data bank. A read request is generated to the row (Row) 1 data of memory bank (Bank) 1, a cache hit occurs because the data from Bank 1 Row 1 is stored at Row 1 of cache data bank CD0. Hence, a row data (hereafter row data including a plurality of bits (256 bits in this case) data is called a row data) from CD0 Row1 is read, and a section of 32 bits selected by the external address is sent to the external data bus.

Figure 4D:
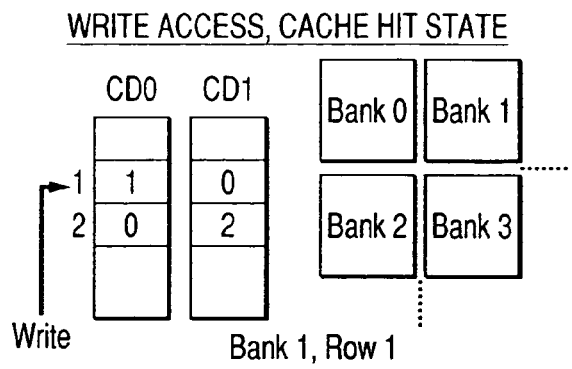
FIG. 4D shows an embodiment of the semiconductor device of the present invention under a write access and a cache hit state.
Figure 4B:
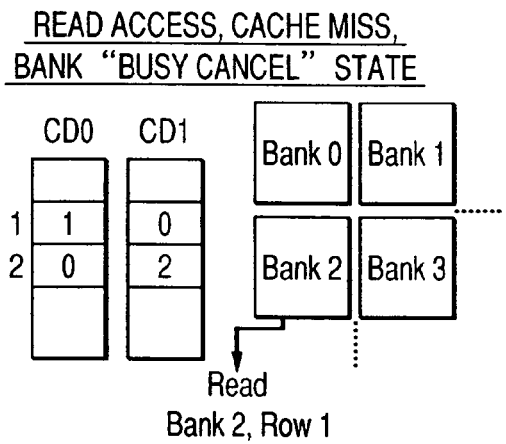
FIG. 4B shows an embodiment of the semiconductor device of the present invention under a read access, a cache miss state, and a bank non-busy state.

FIG. 4B shows the case of a cache miss, and the most recent data is in the Bank and read therefrom. Here a read request is generated to the row data at Row 1 Bank 2, the row data must be read from Bank 2, because Row 1 of the cache data banks CD0, CD 1 stores the data from Bank 1, Bank 0, respectively. Bank 2 in not busy and thus the row data is read from Bank 2 and the selected section is sent to the external data bus.

Figure 4E:
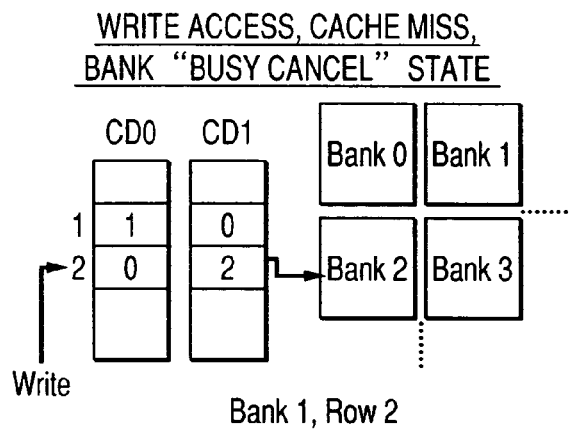
FIG. 4E shows an embodiment of the semiconductor device of the present invention under a write access, a cache miss state, and a bank non-busy state.
Figure 4C:
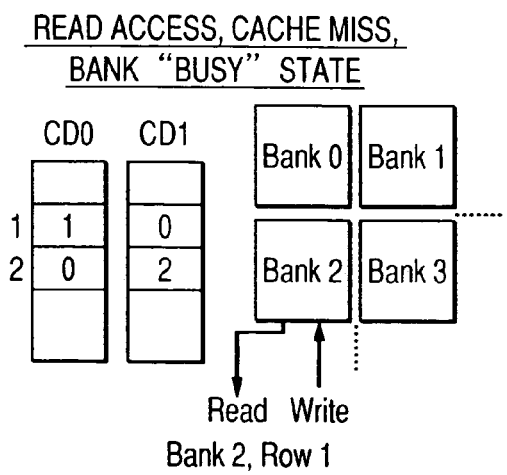
FIG. 4C shows an embodiment of the semiconductor device of the present invention under a read access, a cache miss state, and a bank busy state.

FIG. 4C is different from FIG. 4B, and shows the case where the accessed bank is busy. Here, the read access is generated to the row at Bank 2 Row 1, however, since Row1 of the cache data banks CD0, CD1 hold the row data from Banks 1, 2, respectively, the row data must be read from Bank2. Bank 2 is busy because the write-back operation is undergoing, however, it has the separate read and write ports and thus the row data can be read from Bank 2 without affecting the write-back operation.

The three cases of read operation will be explained in detail. FIG. 4D shows the case of a cache hit, where the most recent data is in the cache data bank, and the most recent row data is updated by the input data. Here, the write request is generated to the row data of Bank 1 Row 1, wherein the row data is stored in the cache data bank CD0, so the stored contents are updated using the input rata, and the write cycle is completed. And since the cache data bank CD0 is a non-destructive write memory, only a part of the row data can be updated with the input data.

FIG. 4E shows the case where all the memory banks are not busy when a cache miss has occurred. In this case, the input data must be stored until the next external read or write operation is executed. Since only a 32 bit section is input from the data bus, the remainder of 7 section data must be read from the corresponding row data of the memory bank, and the read data combined with the data input from the data bus must be combined and stored in the cache data bank.

In the case that at least one of the selected row of the cache data bank is empty, the new row data is written to the empty row and the write cycle ends. However, if all of the selected rows are full (a cache full), it is required to execute a write-back operation for the memory bank to make an empty row to store the input data.

FIG. 4E shows the case where a write request is generated to Bank 1 Row 2, however, since Row 2 of cache data banks CD0, CD1 hold the data from Bank 0, Bank 2, respectively, and therefore, in a cache miss and a cache full state, the write-back operation must be executed to the memory bank. The data of Row 2, the cache data bank CD 1 is written-back to Bank 2 Row 2, where Bank 2 is not busy and the write-back operation can be executed without any problems.

Simultaneously with the write-back operation, the 256 bit row data are read from Bank 1, Row 2, with a part of which the 32 bit input data are combined. After combined, the 256 bit row data at Bank 1, Row 2 are stored at cache data bank CD1, Row 2, and the write cycle ends.

Figure 4F:
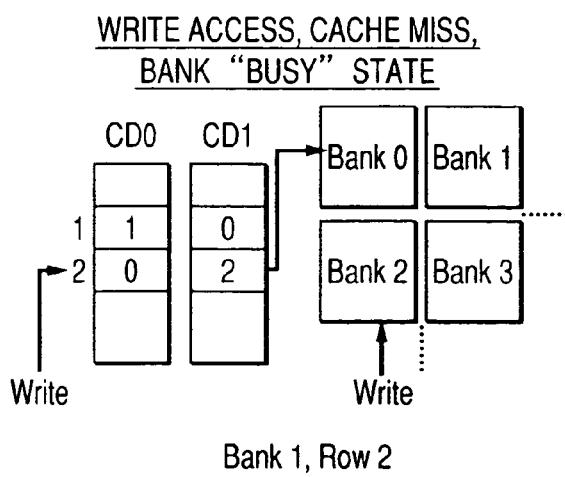
FIG. 4F shows an embodiment of the semiconductor device of the present invention under a write access, a cache miss state, and a bank busy state.

FIG. 4F shows the case where a cache miss has occurred and one of the memory banks is busy with a multiple-cycle write-back operation. The write access is generated to the row data of Bank1, Row2 and since the row 2 of cache data banks CD0, CD 1 hold the row data of Bank 0, Bank 2 hold, respectively, and there is neither a cache miss nor an empty row, a write-back operation must be executed for the memory bank.

In the case of FIG. 4E, the write-back operation was executed for the row data of CD 1, Row 2, to the Row 2 of Bank 2, however, here Bank 2 is continuing the write-back operation already begun (the previous cycle) and busy, that Row 2 of the cache data bank CD1 can not be emptied. Therefore, the write-back operation of the data of Row 2 of the cache data bank CD0 to the Row 2 of the memory bank MB0 is to executed, to form an empty row When the Row2 of the cache data bank CD0 is empty, the 256 bit row data read from Bank 1, Row 2 are combined with the 32 bit input data to be stored at the cache data bank CD0, Row2 Row. Thus the write cycle is completed.

From the operation of 4F, it is known that when selecting a memory bank a write-back operation is executed thereto, it is implemented that there is always a non-busy memory bank by providing multiple cache data banks. That is, if the write operation is completed in 2 cycles, there is at most one busy memory bank at a cycle. Therefore, if two memory banks are provided, then at least one of them is able to respond to the write-back operation. Similarly, if the write operation is completed in 3 cycles, there are two busy memory banks at a cycle at most. Therefore, if three memory banks are provided, then at least one of them is able to respond to the write-back operation.

Thus, the cache data bank redundancy ensures the read and write access at any cycles with no wait states and latencies. With this a fast memory access is implemented, and a less expensive, a highly integrated, and a large capacity memory device become available.

Next, the case of continuous access is examined in order to show that external write accesses to the semiconductor memory are all completed within one cycle. FIG. 5 shows the operation for four continuous accesses to an embodiment of the semiconductor device of the present invention, each of FIGS. A to D illustrates the operation for different cycles, respectively.

FIG. 5 shows the case where 4 continuous accesses are made to the semiconductor device including the main memory device, 2 cycle write-back operation is required thereto. Here, 3 write and one read accesses are executed.

Figure 5A:
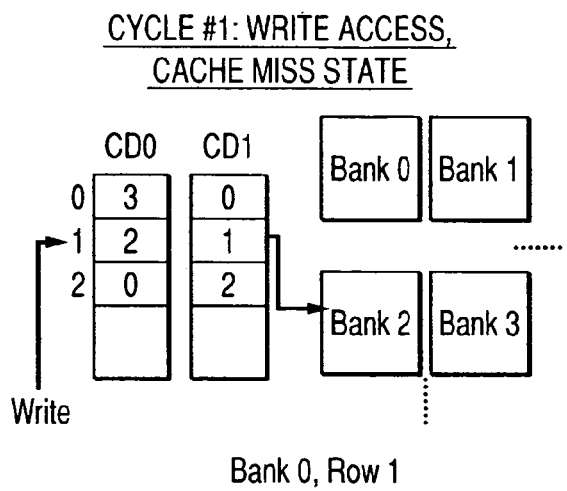
FIG. 5A shows an embodiment of the semiconductor device of the present invention for a sequential write access, in the first cycle in a cache miss state.

FIG. 5A shows the first cycle of operation, where the write operation is generated to the row (Row) 1 of the memory bank (Bank) 0, since the row data of Row1 of Bank 1, Bank 2 are in the cache data banks CD0, CD1, respectively, a cache miss has occurred. So the row data of CD0, Row 1 is written back to Bank 2. And the external input data (sometimes called "Sub row data" in the present description) is combined with the row data read from Bank 0 Row 1 (sometimes called "Full row data" in the present description) and stored in cache data bank CD0, the cycle ends.

Figure 5B:
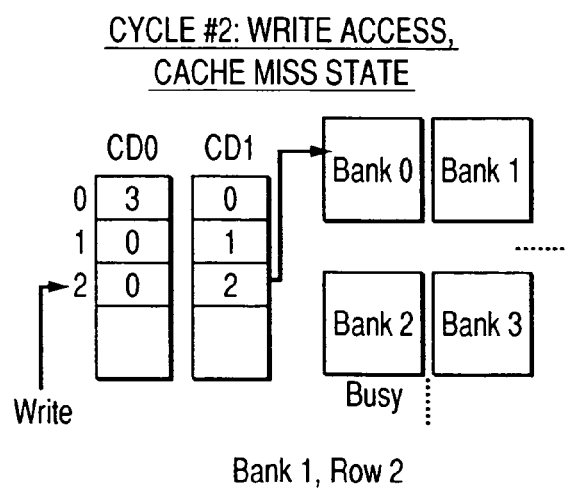
FIG. 5B shows an embodiment of the semiconductor device of the present invention for a sequential write access, in the second cycle in a cache miss state.

FIG. 5B shows the second cycle of operation, where the write operation is generated to access to the row rata of Bank 1, Row 2, however, since the row data of Bank 0 and Bank 2 are in the cache data banks CD0 and CD1, respectively, that a cache miss has occurred. So the row data of Bank 0 or Bank 2 must be written back.

The write port of Bank0 is non-busy state, and the write port of Bank2 is busy because the first cycle write-back operation is undergoing. The data of Bank 0 at CD0, Row 2 is written back, and Sub row data input externally and Full row data read from Bank 1 are combined and stored in CD0, Row 2. In FIG. 5B, the row data of CD0, Row 1 is replaced by the row data of Bank0, Row 1.

Figure 5C:
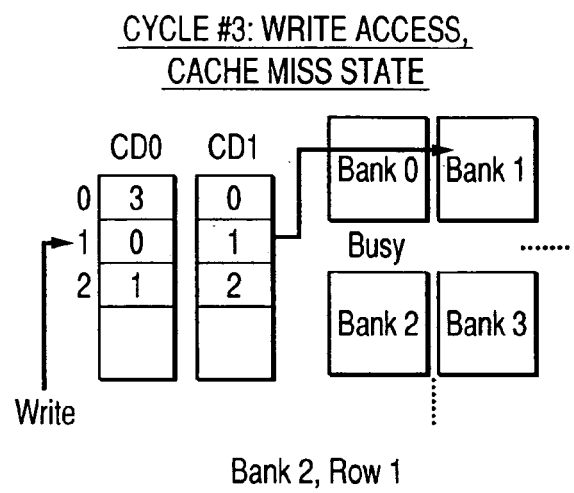
FIG. 5C shows an embodiment of the semiconductor device of the present invention for a sequential write access, in the third cycle in a cache miss state.

FIG. 5C shows the third cycle of operation, where the write operation is generated to access to the data of Bank 2, Row 1, resulting in a cache miss and a cache full, therefore, the write-back operation must be executed. The row data of Bank 0 is stored at CD0, Row1, and the row data of Bank 1 is stored at CD1, Row 1.

However, the write port of Bank0 is busy because the second cycle write-back operation is undergoing. Therefore, the data of Bank1atCD1, Row1 is written-back, and the Sub-row data input externally and the Full-row data read from Bank 2 are combined together and stored in CD1, Row 1.

Figure 5D:
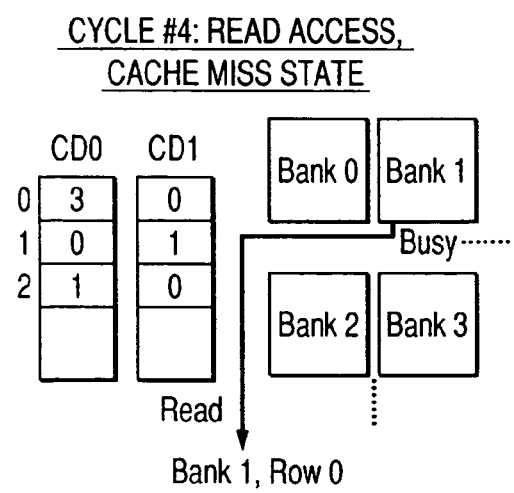
FIG. 5D shows an embodiment of the semiconductor device of the present invention for a sequential read access, in the fourth cycle in a cache miss state.

FIG. 5D shows the fourth cycle of operation, where a read operation is shown after a continuous sequence of the write operation. The read operation is generated to access to the row data of Bank 1, Row 0. In this case, a cache miss is to occur that the row rata of Bank 1, Row 0 must be read first, wherein Bank 1 is busy with the write access of the 3rd cycle, Bank 1 is still able to execute the operation without any penalty, because the access is a read operation.

As mentioned above, a consecutive series of read or write accesses can occur without any latencies or waiting states that would usually occur with ordinary slow write access memory devices.

FIG. 6 is a schematic drawing of the cache data bank and cache tag bank configurations in an embodiment of the semiconductor device of the present invention. The write cycle of a memory bank is assumed to be two times as long as the read cycle time, and two cache data banks CD0 and CD1 are shown together with two cache tag banks CT0 and CT1. Each of the cache data banks CD0 and CD1 includes the same number of rows as that of a memory bank, and the number of data included in each row is the same as the number of columns of a memory bank. That is, in the case that each memory bank with row×column is 256×256 bits, each cache data bank has a composition to include 256 rows, wherein 256 bit row data is stored.

Each of the cache data bank CT0,CT1 also includes the same number of rows as that of a memory bank, and, for example, a valid bit (V) of one bit and a cache tag (TAG) of 7 bits can be stored in each row. The 7 bit cache tag corresponds to 128 memory banks, representing a row data in the cache data bank is the data of which data bank.

Fore example, in the case that a cache tag of CT0, Row 1 indicates Bank 1, which means that the row data of CD0, Row 1 is the row data corresponding to Bank 1, Row1. And in the case the cache tag of CT1, Row 2 indicates Bank 2, which means that the row data of CD1, Row 2 is the row data corresponding to Bank2, Row2. If the valid bit is set to logic level '1', then the row data corresponding to the cache data bank indicates an updated data. If the valid bit is a logic level '0', then the updated row data shown by the cache tag is in the memory bank.

By adding an additional bit, called a dirty bit and not shown, to each row composition of the cache tag bank shown in FIG. 6, the row data is enabled to be stored in the cache data bank at an external read operation. The dirty bit is utilized to specify if a read data from each row of the data bank is modified or not. If modified, the dirty bit is set, thereby indicating to a cache control circuit that the row data must be written back to the memory bank, when it is deleted from the cache data bank. With this composition, the access frequency to the memory bank is expected to decrease and the read or write is to be executed at lower electric power and with higher speed.

Figure 7A:
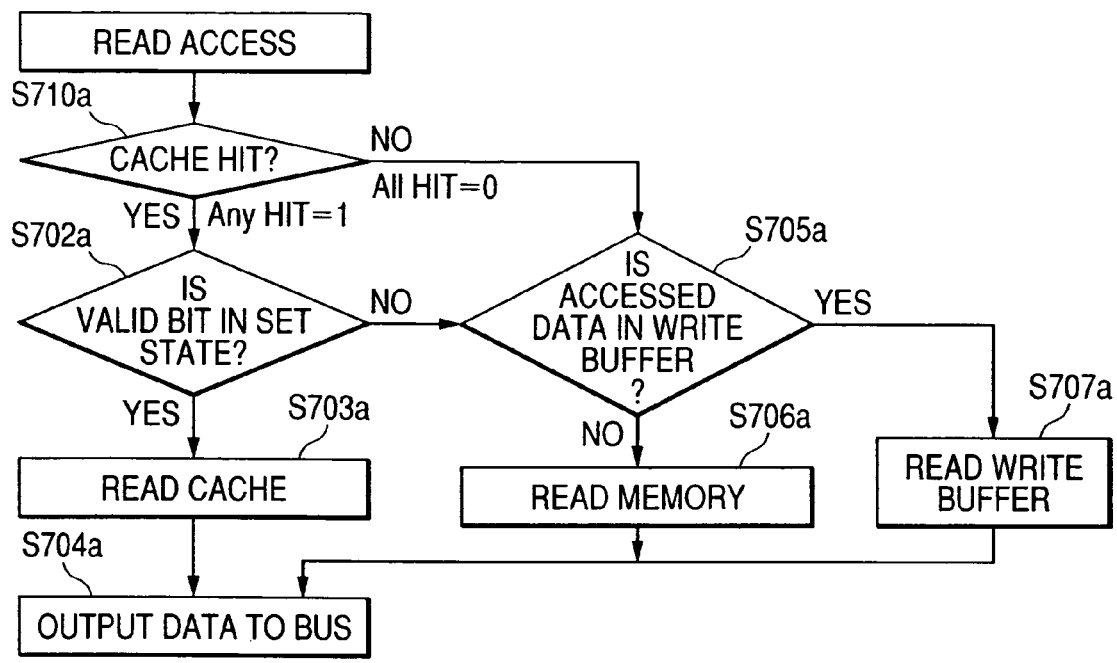
FIG. 7A is a flow diagram illustrating an embodiment of the semiconductor device of the present invention for the read operation.
Figure 7B:
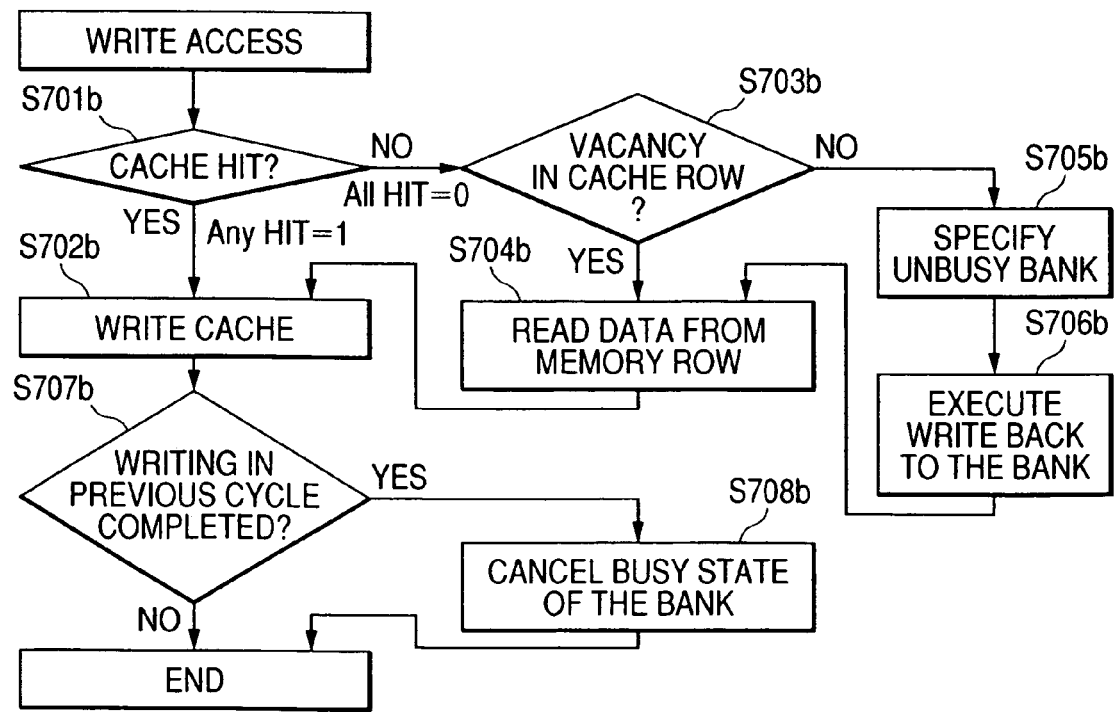
FIG. 7B is a flow diagram illustrating an embodiment of the semiconductor device of the present invention for the write operation.

FIG. 7 is a flow chart of a cache control procedure for an embodiment of the semiconductor device of the present invention. FIG. 7A shows a flow chart of the read access, FIG. 7B shows a flow chart of the write access.

As shown in FIG. 7A, a read access proceeds by first determining whether the accessed data is in the cache data bank. There a memory bank information stored in a cache databank is compared with the external input bank address, and determines whether there is a cache hit or a cache miss (S701*a*). If a cache hit occurs, the valid bit of cache data bank is determined (S702*a*). If the valid bit is set, then the row data is read (S703*a* and S704*a*) directly from the cache data bank to the external data bus since the row data in the cache data bank is the one updated.

While, if a cache miss occurs or if the valid bit is not set, then the row data must be read from the memory bank. The write buffer is checked in the memory bank since the accessed data may be undergoing a write-back operation (S705*a*). If the data is in the buffer, the contents of write buffer are read (S707*a* and S704*a*). If the data is not in the buffer, the row data is read from the specified row in the memory bank (S706*a* and S704*a*).

A write access begins, as shown in FIG. 7B, first by comparing the memory bank address stored in the cache data bank with the external bank address, and then to determine whether a cache hit or a cache miss has occurred (S701*b*). If a cache hit occurs, then the row data stored in the cache bank is updated with the input write data (S702*b*).

If a cache miss occurs, then whether there is any empty row or not is determined in each of the cache data banks (S703b). If there is any empty row available, a full row data is read from the memory bank specified by the input bank address, the input data of 32 bit section data (a sub row data) is combined therewith, and then stored at the empty row of the cache data bank. At this time, the input address is stored in the cache tag bank, furthermore, a valid bit is set (S'704b and S702b).

If a cache miss occurs and there is no empty row available in the cache data banks, one of the row data of a cache data bank must be written back to one of the memory banks. And then, a row data of the cache data bank is specified by the cache control circuit to correspond to a memory bank which is not busy (S705a), the write-back operation is begun to the specified memory bank (S706a). In parallel with this operation, by a similar procedure to the preceding one a full row data is combined with a sub row data to be stored at the empty row in the cache data bank produced by the write-back operation. At the same time the contents of the cache data bank are updated (S704b and S702b).

After the write operation to the data bank is executed in this way, the cache control circuit checks whether the preceding write-back operation is completed or not (S707b). The cache control circuit has recorded the memory bank in a busy state, and if the write-back operation is completed then the memory bank is removed from the record and the write cycle ends (S708b).

Figure 8:
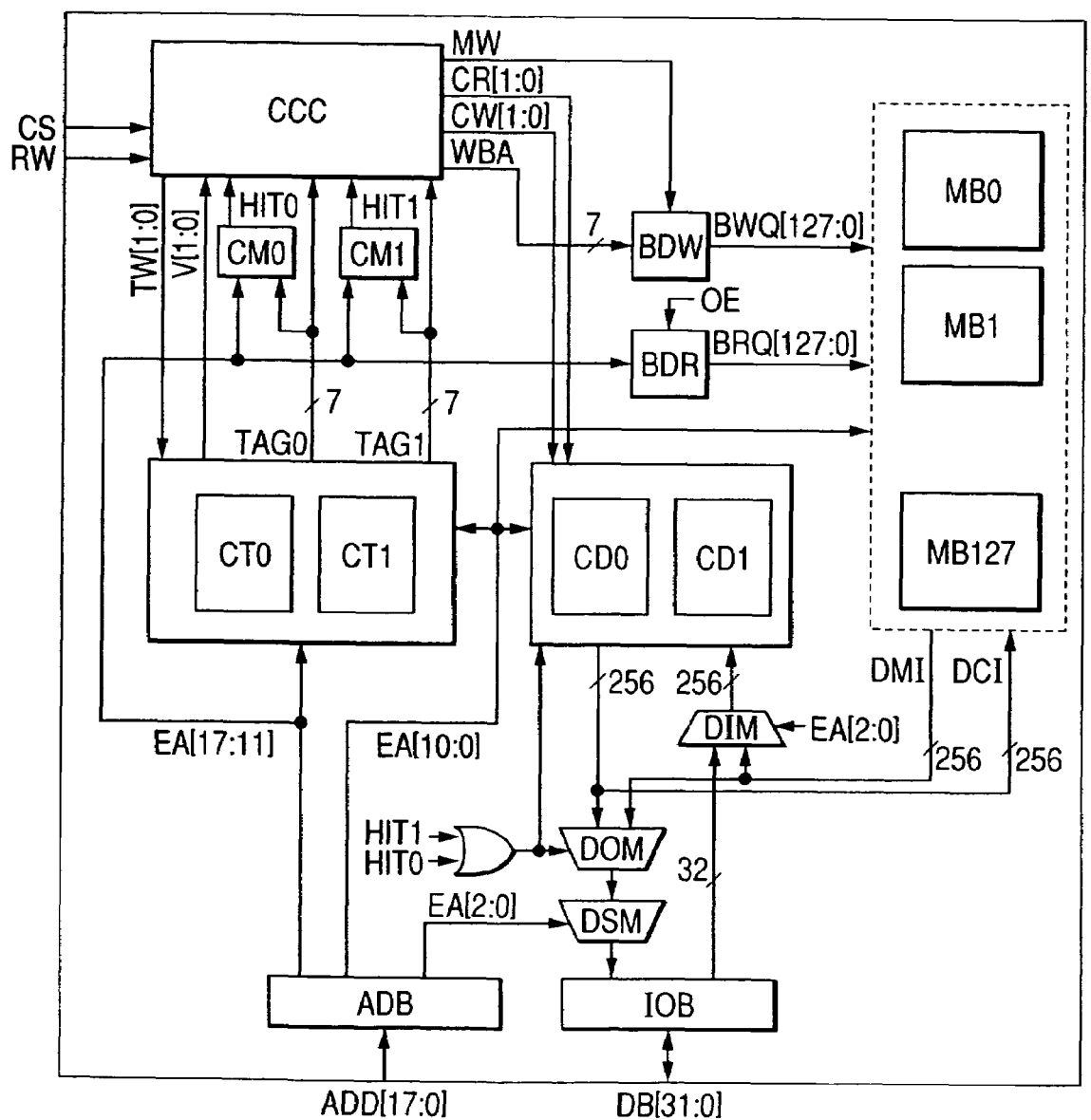
FIG. 8 is a schematic drawing of an embodiment of the semiconductor device of the present invention for a block diagram of the memory configuration.

FIG. 8 is a block diagram of a semiconductor memory composition included in an embodiment of the semiconductor device of the present invention. In the figure, 128 memory banks MB 0 to MB 127 of 2 port memory cells are provided, each memory bank comprises a 256 bit column divided into 8 sections of 32 bits each and 256 rows. In addition, 2 cache tag banks CT0 and CT1 and 2 cache data banks CD0 and CD1 are provided described above, assuming the write access takes twice as long as that of the read access in time with this memory bank.

A cache control circuit CCC, based on the flow chart of FIG. 7, manages the cache tag banks CT0, CT1, the cache data banks CD0, CD1 as well as the access and the like to the memory banks MB0 to MB127. As other additional circuits, there are provided that input address buffer ADB, input and output data buffer IOB, comparator circuits CM0, CM1 to determine a cache hit, read bank decoder BDR selecting the memory bank to be activated and write bank decoder BDW, data bus multiplexer circuits DOM, DSM, and demultiplexer circuit DIM and the like.

Such a semiconductor memory is externally controlled by the following signals: external data (external data bus) DB [31:0], external address (external address bus) ADD [17:0], chip select signal CS, read/write select signal RW, and clock signal CLK (not shown) and the like. The read or write access to the memory starts with setting of external address ADD [17:0], read/write select signal RW, and chip select signal CS.

The chip select signal CS and the read/write select signal RW are input to the cache control circuit CCC. The external address ADD [17:0] is supplied to each circuit as the internal address EA [17:0] via the address buffer ADB. The internal address EA [17:0] is divided into 3 sections. The upper bits of the internal address EA [17:11] represent the memory bank to be selected from the 128 memory banks MB0 to MB127.

The internal address EA [17:11] is, other than the read bank decoder BDR, used to be input to the cache tag banks CT0, CT1, and also to sustain the memory bank addresses of the row data stored in the cache tag banks CT0, CT1 and the like. The middle bits of the internal address EA [10:3] represent the row selected from the 256 rows included by each memory bank. The lower bits of the internal address EA [2:0] represent the section of 32 bits to be selected from the 256 bit row data included in each row. And the internal address EA [10:0] representing the row and the section have been input to the cache tag banks CT0, CT1, the cache data banks CD0, CD1, and the memory banks MB 0 to MB 127.

Next, the explanation is described for the cases of cache hit and miss on the read and write operations of the semiconductor memory shown in FIG. 8. The semiconductor memory operates following the procedure roughly described in the preceding FIG. 7. First, the read access is described in detail.

The read access begins with the operation selected by the assertion of the chip select signal CS and the read/write select signal RW. The data (cache tag) TAG0, TAG1 stored in the internal address EA [10:3] of the cache tag banks CT0, CT1, respectively, are read and sent to the comparator circuits CM0, CM1. In parallel to this procedure, the internal memory bank addresses EA [17:11] are each input to the comparator circuits CM0, CM1. If the cache tags TAG0, TAG1 agree with the internal memory bank addresses EA [17:11], then the cache hit signals HIT0, HIT1 are asserted.

The cache hit signal HIT0 corresponds to a cache hit in the cache tag bank CT0, and the cache hit signal HIT1 corresponds to a cache hit in the cache tag bank CT1. The valid bits V [0:1] are read from the cache tag banks CT0, CT1, and input to the cache control circuit CCC.

In the case of a cache hit and the valid bit set to the logic one, then the read data are stored in the cache data banks (if HIT0, then CD0, if HIT1, then CD1) specified by the cache hit signals. Therefore, the data are read from the cache data bank (e.g. if CR [0], then CD0) specified by the cache read signal (if HIT0, then CR [0]) from the cache control circuit CCC, and sent to the internal cache data bus DC1 (first data bus) with 256 bits. At the read operation, the row of the cache data bank is selected by the internal address EA [10:3].

The data sent to the internal cache data bus DC1 are input to one of the terminals of multiplexer circuit DOM (first select circuit). The internal main data bus DMI (second data bus) is connected to the other terminal from the output bus of the memory banks. The former terminal of the multiplexer circuit DOM is selected by the OR output from the cache hit signals HIT0, HIT1, accordingly, in the case of a cache hit, the internal cache data bus DC1 is selected, and the 256 bit output from the selected multiplexer circuit DOM are input to the multiplexer circuit DSM. In the multiplexer circuit DSM, the 32 bit section of the 256 bit data is selected by the internal address EA [2:0], and the section is sent to the input-output data buffer IOB.

In the case of a cache miss on the read access, the cache tags TAG0, TAG1 at the selected row from the cache tag banks CT0, CT1 are not the same as the internal memory bank addresses EA [17:11], and the cache hit signals HIT0, HIT1 are not activated. Hence, the read bank decoder BDR decodes the internal memory bank addresses EA [17:11], and the read command is issued to the memory banks.

The memory bank (e.g. MB1) executing the read command is selected by the decoded read bank select signal BRQ [127:0] (e.g. BRQ [1]). Since the memory cells in the memory bank have separate read and write ports, the data can be read from the selected memory bank, without depending on whether or not the write-back operation is going on for the bank.

The selected memory bank (e.g. MB 1) outputs the row data of 256 bits selected by internal address EA [10:3] onto the internal main data bus DMI. The output data is input to the multiplexer circuit DOM, then input to the multiplexer circuit DSM via selection of the multiplexer circuit DOM. The 32 bit section is selected by the internal section address EA [2:0] in a similar way mentioned above, and the selected section is output on the external data bus DB [31:0]. The read cycle is completed in this way.

In the above description, the operations for the cases of cache hit and miss are explained separately, however, the operations are executed in parallel in practice for the two cases. That is while the determination of a cache hit or the like is proceeding, the read from the memory bank is executed and finally two outputs are separated by the selection of the multiplexer circuit DOM. The advantage of this process is that the data can be output on the external data bus [31:0] in a short time in the case of a cache miss since there is no need to wait for the comparison of cache hit operation with the cache tag bank CT0, CT1 readout.

As for the write access, the access is accepted by the input of the chip select signal CS and the read/write select signal RW if the input data is available on the external data bus DB [31:0]. When the write access begins, data read is executed from the memory banks MB 0 to MB 127. That is, after the internal memory bank address EA [17:11] is decoded by the read bank decoder BDR, the read command is issued to the memory bank by the memory bank read signal BRQ [127:0]. The 256 bit row data stored in the internal row address EA [10:3] is output onto the internal main data bus DMI [255:0].

The cache control circuit CCC checks cache hit conditions as in the case of read access previously mentioned in parallel to the read operation from the main bank. That is, first the contents of the internal address EA [10:3] at cache tag banks CT0, CT1 are read, and next the cache tags TAG0, TAG1 read from the tag banks are transferred to the comparator circuits CM0, CM1, and compared with the internal memory bank addresses EA [17:11], and specified if a cache hit occurs.

If the cache tag is the same as the internal memory bank addresses EA [17:11], then the cache hit signal HIT0, or HIT1 is activated, and informed to the cache control circuit CCC. This means that since the data to be updated is already in one of the cache data banks (if HIT0, then CD0, if HIT1, then CD1), the 32 bit input data may be written to the cache data bank.

Therefore, the cache control circuit CCC begins with write to the cache data bank (e.g. CD1) That is, first using the internal address EA [2:0] to select the position of the section, the 32 bit input data is accurately positioned in the 256 bit data by the demultiplexer circuit DIM. Next the 256 bit data is input to the cache data bank (e.g. CD1), the row is selected by the internal row address EA [10:3]. And the OR of the cache hit signals HIT0, HIT1 is input to the cache data banks CD0, CD1.

In this state, the cache control circuit CCC activate the cache write signal (e.g. CW[1]). Then, since the cache data bank (e.g. CD1) recognizes a cache hit, only the suitable section data in the data bank (e.g. CD1) is updated by the internal address EA [10:0] indicating the row and the section. Thus read cycle is completed.

On the other hand, a cache miss occurs, when with a similar procedure, the cache tags TAG0, TAG1 are read, and the 7 bit cache tags TAG0, TAG1 are compared with the internal memory bank addresses EA [17:11] by the comparator circuits CM0, CM1 resulting in disagreement. In this case cache hit signals HIT0, and HIT1 are not activated.

Then, the cache control circuit CCC determines if a write-back operation is necessary. Cache tags TAG0, TAG1 are read from cache tag banks CT0, CT1, and if one of the valid bits V [1:0] is logic level zero, then a cache is not full, and there is an empty cache data bank, therefore, the input data can be written to the empty cache data bank without any write-back operation.

In this case, by selecting the demultiplexer circuit DIM (2nd selection circuit) using the internal section address EA [2:0], the selected section from the 256 bit row data is replaced with 32 bit input data. The 256 bit data before the replacement is the one read onto the internal main data bus DMI from the main bank, just after the start of the read access as mentioned before. And when the cache write signal (e.g. CW1) is activated, the 256 bit row data replaced as mentioned before is written to the cache data bank (e.g. CD1) with an empty row by the internal address EA [10:3] since the bank (e.g. CD1) recognizes a cache miss.

In addition, by write to the cache data bank (e.g. CD1) together with activating the write signal (e.g. TW[1]) by the cache control circuit CCC, the internal memory bank addresses EA [17:11] is stored in the specified cache tag bank (e.g. CT1) with an empty row as the tag bank (e.g. TAG1). Thus, the write cycle ends with the cache tag and the row data are stored in the cache tagbank (e.g. CT1) and the cache data bank (e.g. CD1), respectively.

In the case of a cache miss and the cache data banks CD0, CD1 are cache full at the internal row address EA [10:3], the write-back operation is executed before storing the input data in the cache data bank. The cache control circuit CCC checks the cache tags TAG0, TAG1 using internal registers that record the busy memory bank. Since the numbers of the cache tag banks and the cache data banks are both equal to the ratio of the write-back cycle time to the read cycle time of the memory bank, at least one of the cache tags TAG0, TAG1 indicates free memory banks without fail.

The cache control circuit CCC select a memory bank which is not busy with the write-back operation. The 256 bit row data is read from the cache data bank corresponding to the selected memory bank., and output to the internal cache data bus DCI [255:0]. And the cache control circuit CCC generates the memory bank write signal MW and the write bank signal WBA [6:0] to the write bank decoder BDW.

The write bank decoder BDW decodes the write bank signal WBA [6:0], and output the write bank select signal BWQ [127:0]. At the internal row address EA [10:3] selected by the write bank select signal BWQ [127:0], the values of the internal cache data bus DCI [255:0] mentioned before are written-back. The cache control circuit CCC registers the cache tag in the internal register indicating the memory bank being busy, the tag corresponds to the memory bank started the write-back operation. Then the write-back operation ends.

After the write-back operation is finished, similar to the case described before wherein a write-back has not occurred, the write cycle ends by storing the input data in the empty cache data bank (e.g. CD1). And the internal memory bank addresses EA [17:11] is stored in the internal row address EA [10:3] of the cache tag bank (e.g. CT1) by activating the write signal (e.g. TW[1]). By such operations, the write operation can be completed in one cycle without requiring any wait state or latencies not depending on the write-back states of the 128 memory banks MB 0 to MB 127.

Figure 9:
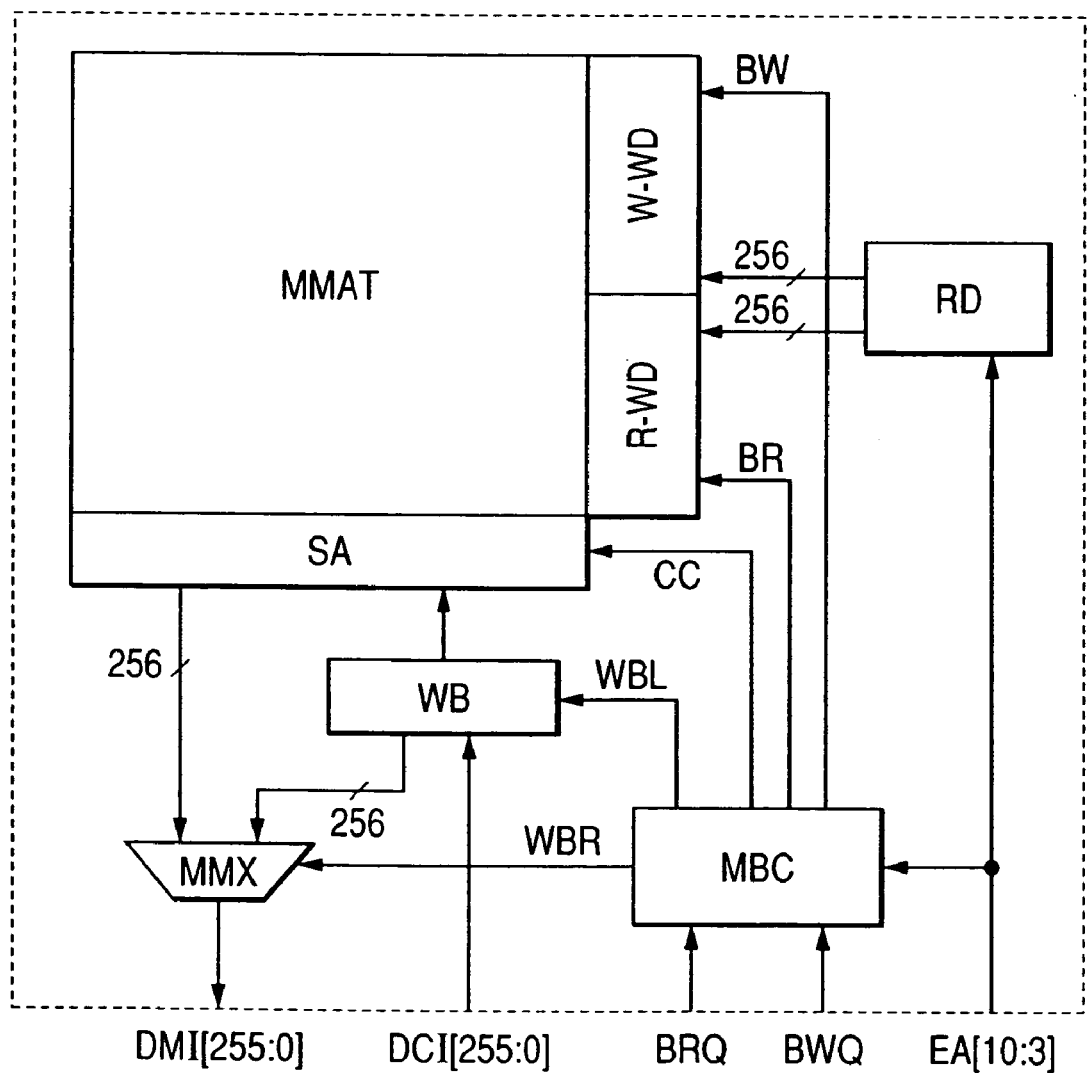
FIG. 9 is a schematic drawing of an embodiment of the semiconductor device of the present invention for a block diagram of the memory bank configuration of FIG. 8.
Figure 10:
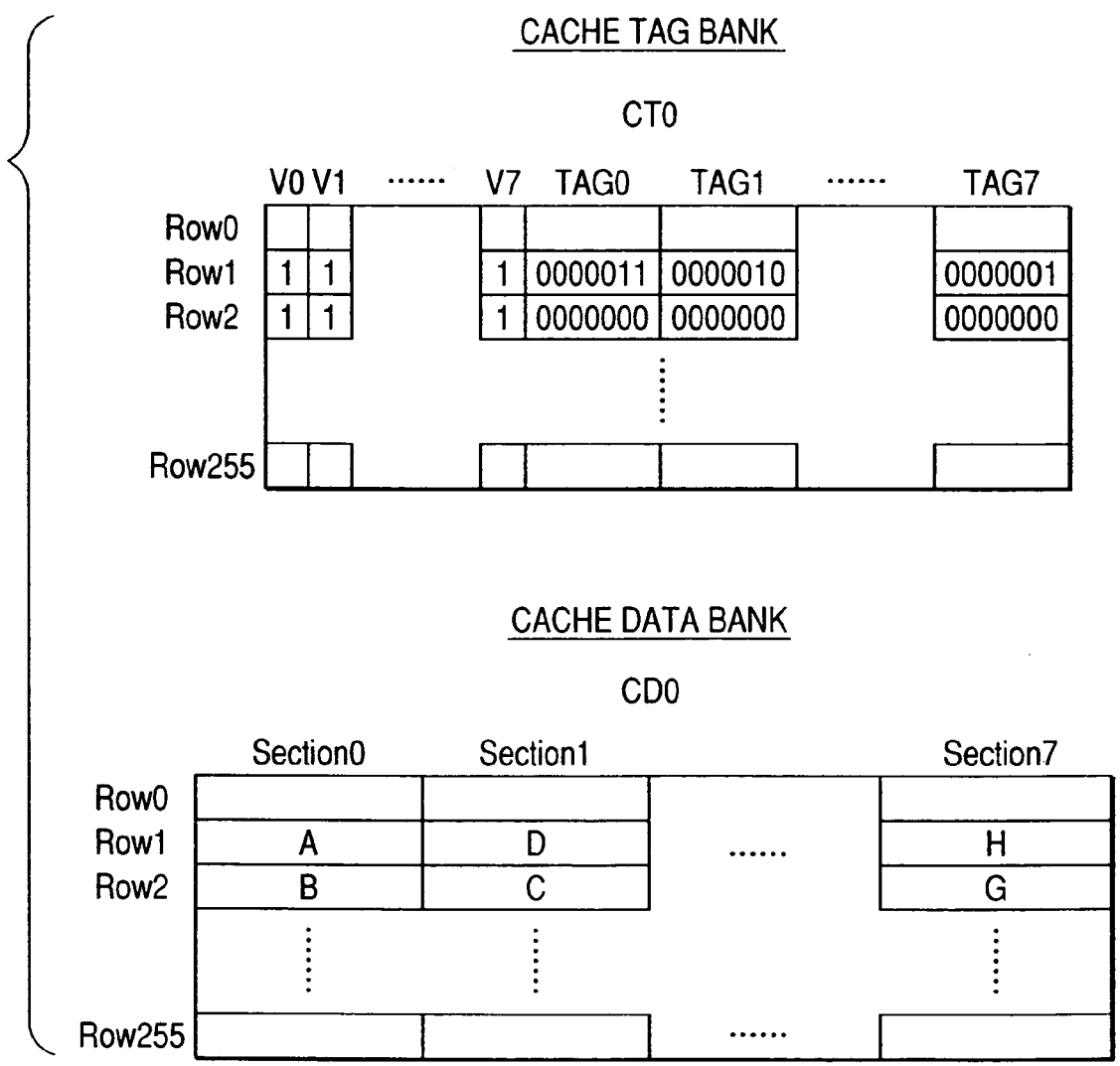
FIG. 10 is a schematic drawing of an embodiment of the semiconductor device of the present invention for a cache data bank and a cache tag bank configurations modified from those of FIG. 6.

FIG. 9 is a block diagram to show an embodiment of the memory bank composition of the semiconductor memory in FIG. 8. The memory bank of FIG. 10 is similar to a general memory array of an SRAM or DRAM and the kike and its peripheral circuit compositions currently used. For example, the memory bank comprises: a memory mat MMAT including a number of memory cells as shown in FIG. 1, read word line drivers R-WD, write word line drivers W-WD, sense amplifiers SA amplifying the read row data, a row decoder RD decoding the internal row address EA [10:3] and specifying the row at read and write, and a memory bank control circuit MBC. Furthermore, the memory bank of FIG. 9 also has a write buffer WB to retain the row data during the write-back procedure.

The read cycle is executed by setting the internal row address EA [10:3], and activating the read bank select signal BRQ. The memory bank control circuit MBC receiving the read bank select signal BRQ activates the bank read signal BR, then the row data at the selected row by the row decoder RD and the read word line drivers R-WD is output to one of the terminals of the multiplexer circuit MMX via the sense amplifier SA. To the other terminal of the multiplexer circuit MMX the output of the write buffer WB is connected.

Memory bank control circuit MBC controls the write buffer read signal WBR, which is the multiplexer circuit MMX select signal, outputs the row data read via the sense amplifier SA on the internal main data bus DMI [255:0]. On the other hand, if the read operation is accessed to the row data the write-back operation is undergoing thereto, the row data needs to be read from the write buffer.

In this case, the memory bank control circuit MBC stores the internal row address EA [10:3] in the write buffer WB determines if the desired row data in the write buffer WB. If the row data is in the write buffer WB, then the contents of the write buffer WB are output by the selection of the write buffer read signal WBR, via the multiplexer circuit MMX, onto the main data bus DMI [255:0]. Thus, the row data can be read without preventing the write-back operations.

The write cycle is executed by setting the 256 bit internal cache data bus DCI [255:0] or the internal row address EA [10:3], and activating the write bank select signal BWQ [127:0]. The memory bank control circuit MBC activates the write buffer latch signal BL generated by the write bank select signal BWQ, latches the data of the internal cache data bus DCI [255:0] to the write buffer WB.

The write operation to the memory mat MMAT begins with decoding the internal row address EA [10:3] by the row decoder RD. Then, the memory bank control circuit MBC activates the bank write signal BW, the row selected by decoding of the row decoder RD is activated through the write word line drivers W-WD, the row data in the write buffer WB is written back over a plurality of cycles.

In the semiconductor device so far described, the width of the data bus is the number of lines of the memory bank bit lines, that is, the 256 bits. However, some advantages may be achieved such as a reduction in the lay out area or in switching electric power and the like by reducing the data bus width. Accordingly, in the procedure of the cache write and the write-back cycles, for example, the architecture may be useful wherein exchange of data between not the total of 256 bits, but the 32 bit section data and the memory bank data is executed. An embodiment of this architecture is explained in the following.

FIG. 10 is a schematic diagram to show an embodiment of the cache data bank and cache tag bank architecture modified from FIG. 6 of the semiconductor device of the present invention. In FIG. 10 similar to the previous one, the cache data bank CD0 and the cache tag bank CT0 are provided to execute read or write access random at each cycle without any latencies or waiting time. However, different from the composition shown in FIG. 6, the composition is adopted wherein the 32 bit section is employed for the transmission and reception of the data between the memory bank and the cache data bank.

The cache data bank CD0 is composed of the same number of rows and columns as that of the memory bank. And also similarly as the memory bank, each row is divided into several sections, one of which is read from or written to when transmitting to or receiving the data at the communication with the memory bank. That is, for example in the composition, the row1 of the cache data bank CD0 and the value D of the section 1 are transmitted or received again.

The cache tag bank CT0 have a plurality of 7bit tags for corresponding to each section data of the cache data bank CD0. Each row of the cache tag bank CT0 has 8 cache tags TAG 0 to TAG 7, and 8 valid tags V0 to V7 each corresponding thereto. The 8 valid tags V0 to V7 are used to determine whether the corresponding 8 section data of the cache data bank are valid or not.

In the case, for example, the V1 of the cache tag bank CT0 is set to "1", and the cache tag TAG1 is set to "0000010", then the data at the section of the row 1 of cache data bank CD0 is valid, and the valid data indicates the most recent data at the section 1 of the row 1 of memory bank MB2. And that the V7 of the row 1 of cache tag bank CT0 is set to "1", and TAG 7 is to "0000001", then the data at the section 7 of the row 1 of cache data bank CD0 is valid, and the valid data indicates the most recent data at the section 7 of the row 1 of memory bank MB1.

The number of cache data banks in this embodiment is different depending on whether the memory bank is a nondestructive-write memory or a destructive-write memory. In the case of a destructive write memory, the entire data row must be stored during the write-back operation. During a write-back operation, since only one section of data is stored in the cache data bank, an internal pre-read must be taken in the memory bank, so that the row data contents are combined with the data from the cache data bank. Following the pre-read, the normal multi-cycle write operation is executed in the memory bank, and the data is stored.

Therefore, a write-back operation requires additional cycles for the case that the entire row data is stored in the cache data bank. That is, the total number of write-back cycles is N+1, where N is the number of cycles required for the internal write operation, and the additional cycle is for the internal pre-read operation for combining the section data with the row data.

For a non-destructive write memory, since only a single section can be written to the memory bank during an internal write operation, that an internal pre-read operation is not required in the memory bank. Therefore, the number of write-back cycles is N, which is the number of cycles required for the internal write operation. Number of cache tag banks is also equal to the number of write-back cycles. That is, for a destructive memory N+1 cache data banks are required, whereas for a non-destructive memory, N cache data banks are required.

FIG. 11 illustrates an embodiment of the semiconductor device of the invention, including the internal pre-read for continuous accesses of the semiconductor device of the invention. FIGS. 11A to 11D each indicate the operations for different cycles. In the figure, the memory banks o to 3 are destructive write memories, furthermore, the write operation to each section is assumed. Accordingly as previously described, the write-back operation requires 3 cycles of the pre-read cycle and the write cycle (2 cycles), corresponding to this, 3 cache data banks CD0, CD1, and CD2 are provided. In FIG. 11, only a single section is shown for each row of each cache data bank, for clarity of explanation (in practice e.g. 8 sections are included).

Figure 11A:
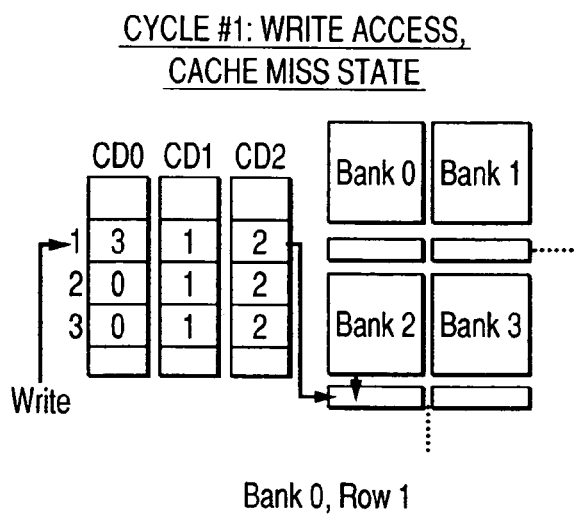
FIG. 11A shows an embodiment of the semiconductor device of the present invention for a sequential write access, in the first cycle in a cache miss state.

FIG. 11A shows the first cycle operation, and the write request is generated for the row of memory bank MB0. In this case, all the rows of the cache data banks CD0 to CD2 are in a cache full state and a cache full state, so that a write-back operation is to be executed. Here, data for Bank2, Row1 stored in the cache data bank2 Row1 is written-back, and thereby the input data of Memory Bank0 Row1 is stored in the empty location.

The write-back operation to Memory Bank2 Row1 begins with the pr-read of Memory Bank2 Row1, the row data read by the pre-read is combined with input from the cache data bank CD2 (section data) the new data thus generated is retained in the buffer of Memory Bank2.

Figure 11B:
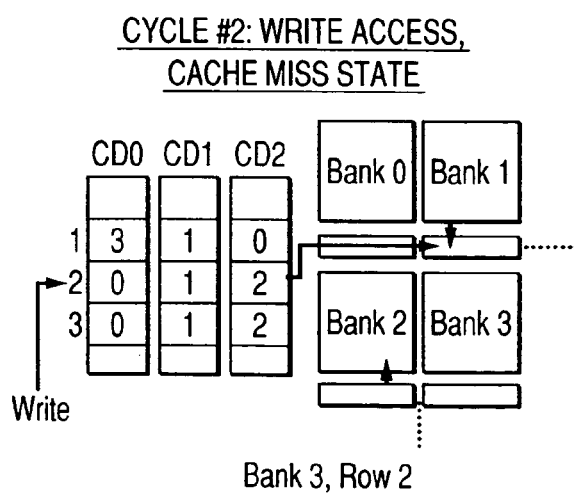
FIG. 11B shows an embodiment of the semiconductor device of the present invention for a sequential write access, in the second cycle in a cache miss state.

FIG. 11B shows the second cycle operation, and the write request is generated to Memory bank3 Row2. Since Row2 for all cache data banks CD to CD2 are full, and cache miss, a write-back operation is again executed. Here, the section data of in the cache data bankCD2 Row2 corresponds to Memory bank2, which is busy, therefore, the Memory bank1 data stored in the cache state bank CD1 Row2 is selected for the write-back. And the input data to Memory bank3 Row2 is written to the cache bank CD1 Row2 which is empty.

At this time, the pre read operation for Memory bank1 Row2 is executed, and the read data is combined with the section data from Cache data bankCD1, and stored in the Memory bank 1 write buffer. And the first cycle of the internal write-back operation is begun.

Figure 11C:
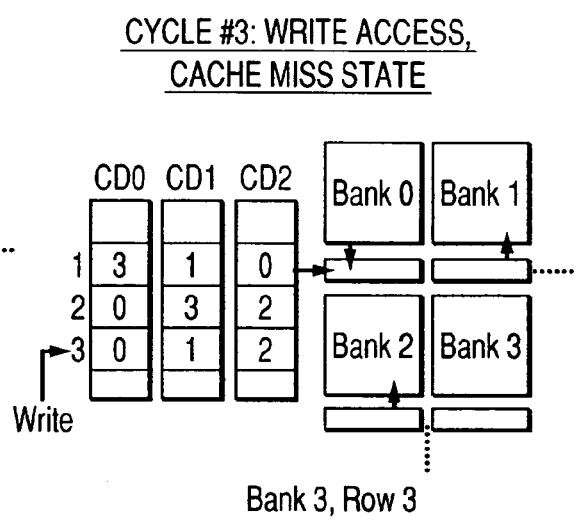
FIG. 11C shows an embodiment of the semiconductor device of the present invention for a sequential write access, in the third cycle in a cache miss state.

FIG. 11C shows the third cycle operation, and the write request is generated to Memory bank3 Row3. The write-back operation must be executed from one of cache data banks CD to CD2. In this case, memory bank2 and memory bank3 corresponding to cache data bank CD2, CD3, respectively, are both busy that the Memory bank MB0 section data stored in Cache data bank CD0 is selected for the write-back operation, and the input data is written to the empty location thus prepared.

Memory bank 2 is busy since the second cycle of the internal write-back operation is undergoing, and Memory bank 1 is also busy since the first cycle of the internal write-back operation is undergoing. Thus, since 3 cache data banks are provided, a write-back-operation is always possible to a memory bank which is not busy.

Figure 11D:
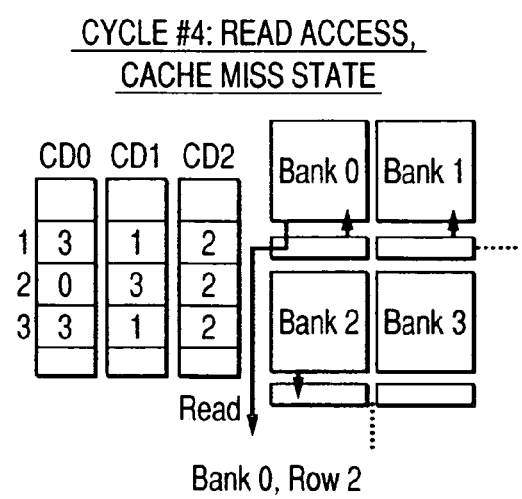
FIG. 11D shows an embodiment of the semiconductor device of the present invention for a sequential read access, in the fourth cycle in a cache miss state.

FIG. 11D shows the fourth cycle operation, and the read request is generated to Memory bank0 Row2, Memory bank 2 is busy since the first cycle of the internal write-back operation is undergoing, however, since the memory cells of Memory bank 0 have separate read and write ports, the read access can be completed in one cycle.

Figure 12:
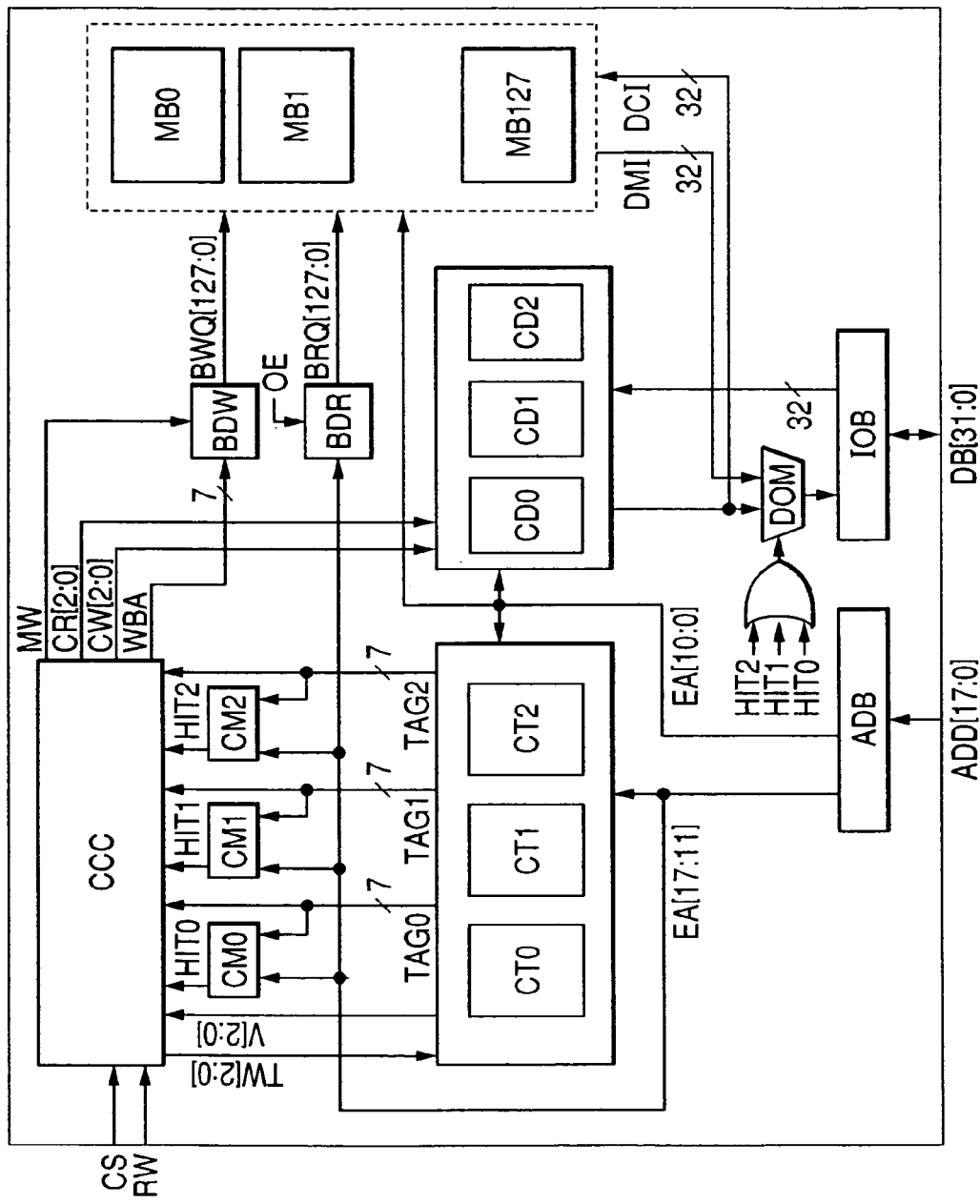
FIG. 12 is a schematic drawing of an embodiment of the semiconductor device of the present invention wherein a section data memory system corresponds to the semiconductor memory of FIG. 8.

FIG. 12 is a block diagram to show an embodiment of the memory composition corresponding to the section data memory system of FIG. 8 of the semiconductor device of the present invention. Since the composition of the semiconductor memory is similar to the one described previously in FIG. 8, only modified part is mainly explained to enable to store sectional data.

As described before, in the case that a memory bank is used requiring one cycle pre read and 2 cycle write operations in the write-back operation, there must be provided with 3 cache data banks CD0, CD1, and CD2 and 3 cache tag banks CT0, CT1, and CT2. With this, the cache control circuit CCC is modified to enable the cache tag TAG2 from the Cache tag bank CT2, the cache hit signal HIT2 and the valid bit V2 are input. The cache hit signal HIT2 is generated by the comparator CM2 comparing the cache tag TAG2 with the internal memory bank addresses EA [17:11].

The cache control circuit CCC outputs the tag write signal TW[2] to the cache tag bank CT2, and the write signal CW[2] and the cache read signal CR[2] to the cache data bank CD2. Furthermore, cache tag banks CT0, CT1, and CT2 and cache data banks CD0, CD1, and CD2 input the internal address EA [2:0], in addition to the internal row address EA [10:3]. This is because the cache data banks and the cache tag banks must place the cache tags and data in the appropriate sections.

In order to transmitting and receiving data in the unit of a section, the data input and output bus for the cache data banks CD0 to CD2 has a width of 32 bits. And the internal cache data bus DC1 and the internal main data bus DM1 also have the width of 32 bits. Thus, all the internal buses have the width of 32 bits, therefore, the demultiplexer circuit DIM to expand the 32 bit section input to the 256 bit full segment and the multiplexer circuit DSM to select an output 32 bit section from the 256 bit row have been both removed. Except this, the compositions and operations are similar to FIG. 8.

Figure 13:
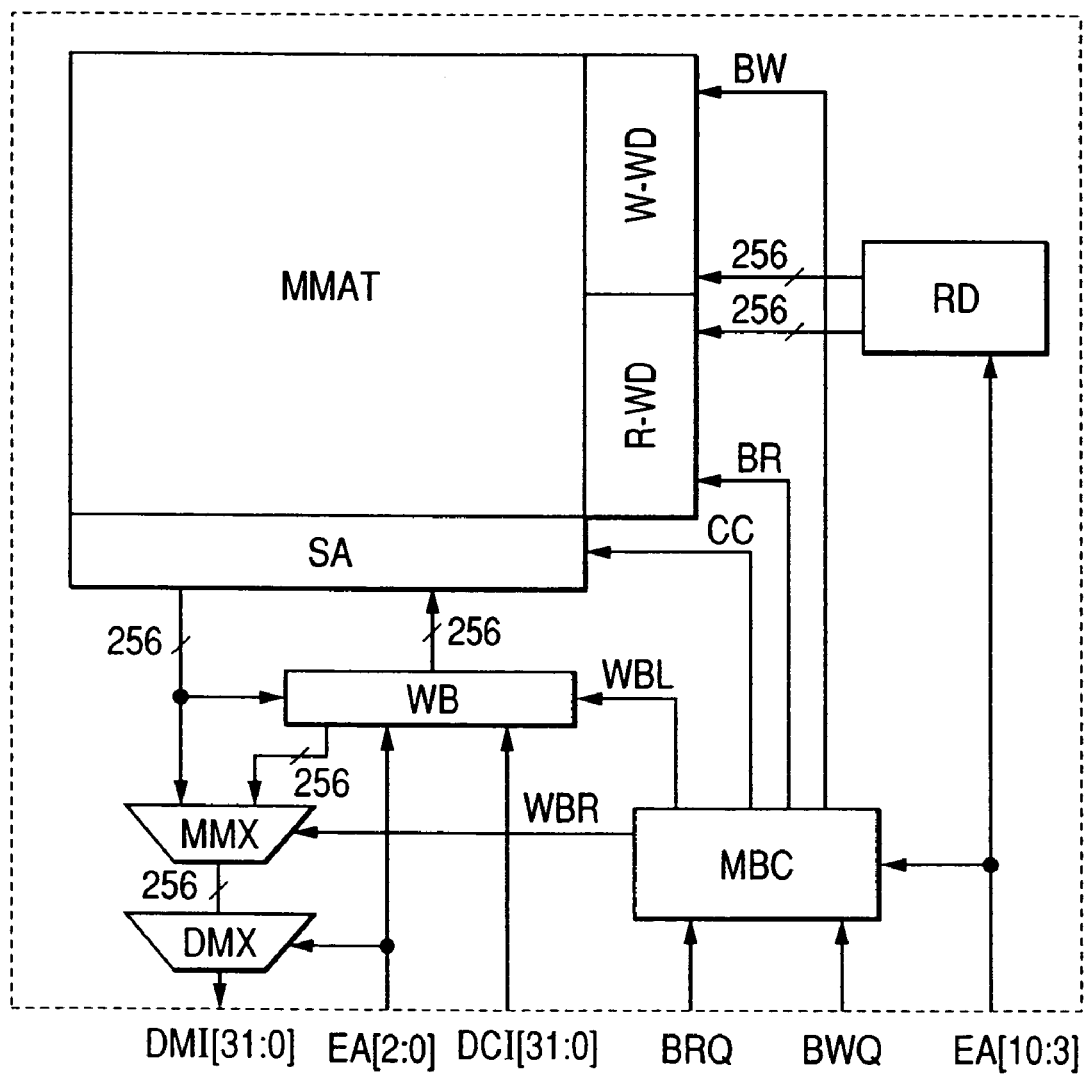
FIG. 13 is a block diagram of an embodiment of the memory bank configuration in the semiconductor memory of FIG. 12.

FIG. 13 is a block diagram to show an embodiment of the memory bank composition of the semiconductor memory in FIG. 8. The memory bank composition and operation of the semiconductor memory in FIG. 13 are similar to those in FIG. 9, only the differences will be described. Since only a 32 bit section is transmitted to the cache data banks and to the external bus, the internal main data bus and the internal cache data bus are both 32 bits wide.

The pre dead operation of the row data from the decoded internal row address EA [10:3] row data must be executed at the beginning of the write-back operation. Therefore, first the memory bank control circuit MBC read the 256 bit row data from the memory mat MMAT, stores it in the write buffer WB via the sense amplifiers SA.

Next, the 256 bit row data must be combined with the 32 bit input data from the internal cache data bus DC1 [31:0]. The input data is stored in the appropriate section on the write buffer WB by controlling the write buffer latch signal WBL with the memory bank control circuit MBC. In this manner, the input data is over-written on the appropriate section of row data, resulting 256 bit row data is stored in the write buffer WB, and the pre read cycle ends. After that, the row data of write buffer WB is stored in the memory mat MMAT in the 2-cycle write operation.

As for the read access, 2 cases are considered. One is the case wherein the row data of the internal row address EA [10:3] is selected under the write-back operation. In this case, since the row data is stored in the write buffer, the row data is output from the multiplexer circuit MMX by the write buffer read signal WBR generated by the memory bank control circuit MBC similar to FIG. 9. The row data output from the multiplexer circuit MMX is further selected by the multiplexer circuit DMX, which converts the selected signal to the internal section address [2:0], and the selected section is sent to the external data bus [31:0].

The other one is the case wherein the input internal row address EA [10:3] selects the row data, which id not under the write-back operation. In this case, the contents of row data can be directly read from the memory mat MMAT. The row data from the memory mat MMAT is connected to another input of the multiplexer circuit MMX, the memory bank control circuit MBC select the multiplexer circuit MMX to output the row data to the multiplexer circuit DMX. Thus as described before the wanted section is selected by the multiplexer circuit DMX, and sent to the internal main data bus DMI [31:0].

By such modifications, the memory banks can be operated so that only a section in the row data is sent onto the internal main data bus DM1 and the internal cache data bus DC1, resulting in the benefits for the memory systems with small data buses.

Although the invention has been described based on preferred embodiments, the invention is not limited to the described embodiments, and it is to be understood that various modifications are possible without departing from the spirit and the scope of the invention.

For example, the embodiment which uses an SESO memory as a main memory device is described, however, not limited to this embodiment, a device wherein the write access is slower than the read access such as a flush memory, a phase-change memory or the like can be used with separate read and write ports.

The semiconductor device of the present invention is an especially effective technique applicable to on-chip memories such as those of microprocessors and microcomputers to which a large capacity and a high speed access are required and furthermore, not limited to this, the easy and high-speed technique can be applied to single unit semiconductor memories and suchlike with a slow write access.

What is claimed is:

1. A semiconductor device including a plurality of memory banks, comprising:
    a first memory device capable of reading data within a first cycle time, writing data within a second cycle time longer than the first cycle time, and reading and writing data in parallel in time; and
    a second memory device capable of reading and writing of data within the first cycle time and that operates as a cache memory of the first memory device, wherein
    the functions executes, in the case that the second memory device causes cache miss and cache full when a write data instruction is issued:
    the process of selecting a unbusy memory bank in writing of data from the plurality of memory banks in the first memory device in the first cycle time,
    the process of writing back the memory data corresponding to the selected memory bank from the stored data in the second memory device, and
    the process of writing the input data associated with the data write instruction to an empty memory region in the second memory device caused by the write-back operation.

2. A semiconductor device according to claim 1, wherein each of the plurality of memory banks has a first memory capacity,
    the second cycle time is equal to or longer than the double of the first cycle time, and
    the second memory device has a memory capacity equal to or larger than the twice of the first memory capacity.

3. The semiconductor device according to claim 2, wherein
    the first memory device includes a transistor having a channel region with a thickness of equal to or less than 5 nm, and
    the second memory device includes a SRAM memory cell.

4. The semiconductor device according to claim 1, wherein
    the first memory device includes a transistor having a channel region with a thickness of equal to or less than 5 nm, and
    the second memory device includes a SRAM memory cell.

5. A semiconductor device according to claim 1, wherein at least number of N cache tag banks and at least the N cache data banks comprises SRAM memory cells.

6. A semiconductor device comprising:
    a plurality of memory banks, each storing a number of M data sequences and requiring a cycle time for write data N ($N \geq 2$) times as long as a cycle time for read data;
    at least the number of N cache data banks operating as the cache memories of the plurality of memory banks, and each storing number of M data sequences, and based on the N times number of cycle time,
    at least the number of N cache tag banks, each storing M memory bank addresses to determine to correspond to which one of the plurality of memory banks for each of the M data sequences stored in at least the N cache data banks, and
    a controller to determine a cache hit and a cache full, and to control the plurality of memory banks, at least the number of N cache data banks, and at least the number of N cache tag banks.

7. A semiconductor device according to claim 6, wherein the controller comprises the processes of:
    determining a cache hit or a cache miss and a cache full by comparing at least the N memory bank addresses each read from the input data sequence in at least the N cache data banks with the input memory bank addresses, when the data write instruction is issued accompanying an external input data and an external input address including an input memory bank address and an input data sequence address to determine any of the data sequences from among the M data sequences stored in the plurality of memory banks;
    selecting a memory bank address corresponding to the memory bank not during data writing from at least the N memory bank addresses read from at least the N cache tag banks in the case that the determined result has a cache miss and a cache full,
    writing back the data sequence corresponding to the selected memory bank address from among at least the N data sequences each stored at the input data sequence address in at least the N cache data banks to the memory bank corresponding to the selected memory bank address;
    storing the external input data in the region wherein the written-back data was stored in at least the N cache data banks; and
    storing the input memory bank address in the region wherein the selected memory bank address was stored in at least the N cache tag banks.

8. A semiconductor device according to claim 7, wherein each of at least the N cache tag banks further stores N valid bits stored in at least the N cache data banks showing whether each of the M data sequences is a valid data sequence or not, and
    the controller determines whether the cache is full or not by reading at least N valid bits at at least the N memory bank addresses from at least the N cache tag banks.

9. A semiconductor device according to claim 7, wherein each of the plurality of memory banks comprising a write buffer temporally holding the written-back data sequence during the write-back process, and
    the controller executes:
    the process of determining the cache hit or cache miss, when the data read instruction with the external input address is issued, the process of determining whether the data sequence corresponding to the external input address is in the write buffer or not if the determined result is a cache miss, and the process of reading and externally outputting the data sequence in the write buffer if the data sequence is in the write buffer.

10. A semiconductor device according to claim 7, wherein at the storing process of storing the input data with the controller, the region where the data sequence written-back is stored, includes a plurality of sections, and in the case that one of the plurality of sections is updated, and the controller executes:

the process of pre-reading the data sequence from the external input address of the plurality of memory banks in parallel in time with the process of determining if the cache hit or the cache miss occurs, the process of recording one section of the data sequence pre-read to the region where the data sequence written-back is stored after the write-back process in the case the previously determined result is a cache miss or a cache full.

11. A semiconductor device according to claim 6, wherein a data read instruction is issued accompanying the input memory bank address and the input data sequence address to determine any of the data sequences from among the M data sequences stored in the plurality of memory banks, wherein the controller executes:

the process of determining a cache hit or a cache miss by comparing at least N number of the memory bank addresses each read from the input data sequence addresses in at least the N cache tag banks, with the input memory bank address;

the process of prereading data sequences from the input memory bank addresses of the plurality of memory banks and the input data sequence address, in parallel in time with determining process of the cache hit or cache miss;

the process of externally outputting the preread data sequence from the plurality of memory banks, if the determined result is a cache miss.

12. A semiconductor device according to claim 6, wherein at least number of N cache tag banks and at least the N cache data banks comprises SRAM memory cells.

* * * * *